United States Patent
Tanaka et al.

(10) Patent No.: US 9,137,900 B2
(45) Date of Patent: Sep. 15, 2015

(54) ELECTRONIC COMPONENT INCORPORATED SUBSTRATE AND METHOD FOR MANUFACTURING ELECTRONIC COMPONENT INCORPORATED SUBSTRATE

(71) Applicant: SHINKO ELECTRIC INDUSTRIES CO., LTD., Nagano-ken (JP)

(72) Inventors: Koichi Tanaka, Nagano (JP); Nobuyuki Kurashima, Nagano (JP); Hajime Iizuka, Nagano (JP); Tetsuya Koyama, Nagano (JP)

(73) Assignee: Shinko Electric Industries Co., Ltd., Nagano-ken (JP)

( * ) Notice: Subject to any disclaimer, the term of this patent is extended or adjusted under 35 U.S.C. 154(b) by 54 days.

(21) Appl. No.: 13/968,620

(22) Filed: Aug. 16, 2013

(65) Prior Publication Data

US 2014/0063768 A1    Mar. 6, 2014

(30) Foreign Application Priority Data

Aug. 29, 2012   (JP) .................. 2012-188798

(51) Int. Cl.

| H05K 1/18 | (2006.01) |
| H05K 3/36 | (2006.01) |
| H01L 23/00 | (2006.01) |
| H01L 23/31 | (2006.01) |
| H01L 21/48 | (2006.01) |
| H01L 23/538 | (2006.01) |
| H01L 21/56 | (2006.01) |

(52) U.S. Cl.
CPC ............ *H05K 1/185* (2013.01); *H01L 21/4846* (2013.01); *H01L 23/3121* (2013.01); *H01L 23/5385* (2013.01); *H01L 24/97* (2013.01); *H05K 3/36* (2013.01); *H01L 21/563* (2013.01); *H01L 24/13* (2013.01); *H01L 24/16* (2013.01); *H01L 24/32* (2013.01); *H01L 24/73* (2013.01); *H01L 2224/131* (2013.01); *H01L 2224/13144* (2013.01); *H01L 2224/16237* (2013.01); *H01L 2224/2919* (2013.01); *H01L 2224/32225* (2013.01); *H01L 2224/73204* (2013.01); *H01L 2924/1533* (2013.01); *H01L 2924/1815* (2013.01); *H01L 2924/351* (2013.01); *H05K 1/186* (2013.01); *H05K 2201/042* (2013.01); *H05K 2201/10674* (2013.01); *Y10T 29/49126* (2015.01)

(58) Field of Classification Search
CPC ........... H05K 1/18; H05K 1/36; H05K 1/136; H01L 2225/06548
See application file for complete search history.

(56) References Cited

U.S. PATENT DOCUMENTS

| 7,863,735 B1 * | 1/2011 | Cho et al. ........................ 257/723 |
| 2009/0008765 A1 | 1/2009 | Yamano et al. |
| 2010/0244219 A1 * | 9/2010 | Pagaila et al. ................. 257/686 |
| 2011/0256662 A1 | 10/2011 | Yamano et al. |
| 2012/0319294 A1 * | 12/2012 | Lee et al. ....................... 257/774 |

FOREIGN PATENT DOCUMENTS

WO   WO2007/069606   6/2007

* cited by examiner

*Primary Examiner* — Peniel M Gumedzoe
(74) *Attorney, Agent, or Firm* — Fish & Richardson P.C.

(57) ABSTRACT

An electronic component incorporated substrate includes a first substrate and a second substrate electrically connected to each other by a spacer unit. An electronic component is mounted on the first substrate and arranged between the first substrate and the second substrate. A first encapsulating resin is formed between the first substrate and the second substrate to encapsulate the electronic component. A second encapsulating resin is formed on a first surface of the first encapsulating resin to fill a space between the first encapsulating resin and the second substrate. The spacer unit includes a stacked structure of a first solder ball, a metal post, and a second solder ball stacked in a stacking direction of the first substrate and the second substrate.

12 Claims, 20 Drawing Sheets

Fig.5A
Fig.5B
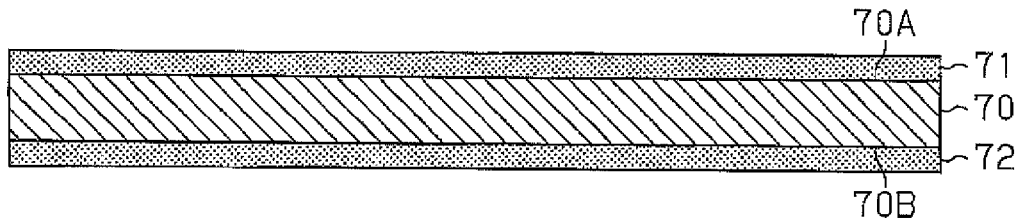
Fig.5C
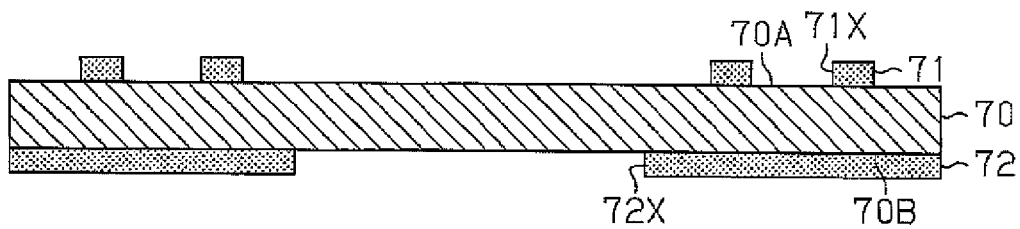
Fig.5D
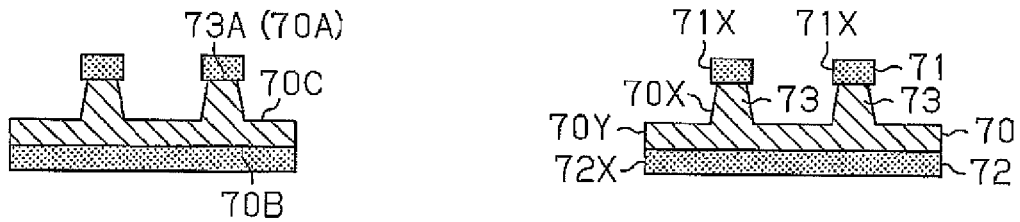
Fig.5E
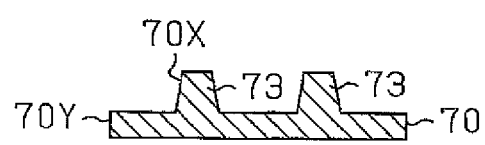
Fig.5F
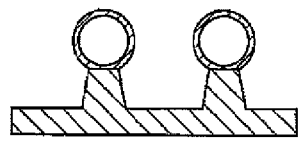
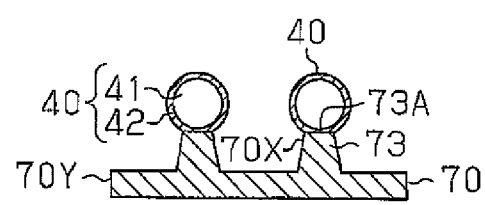

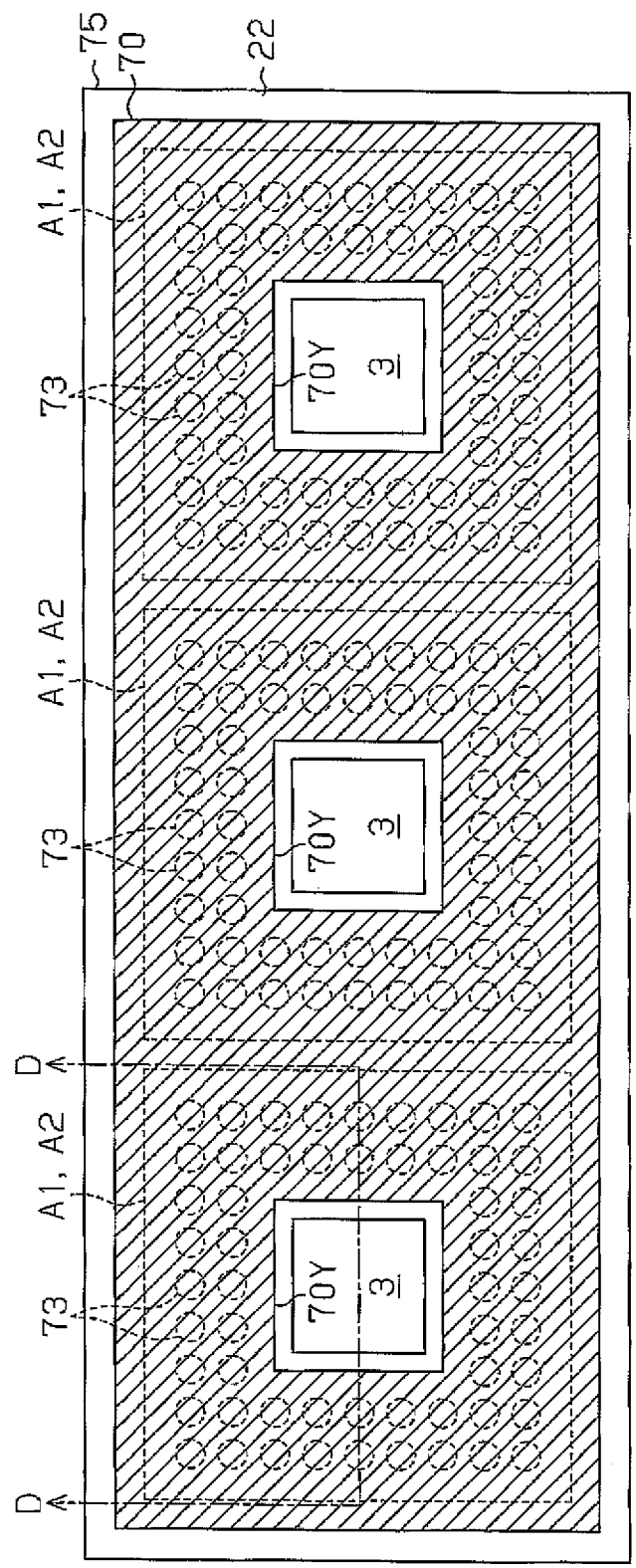

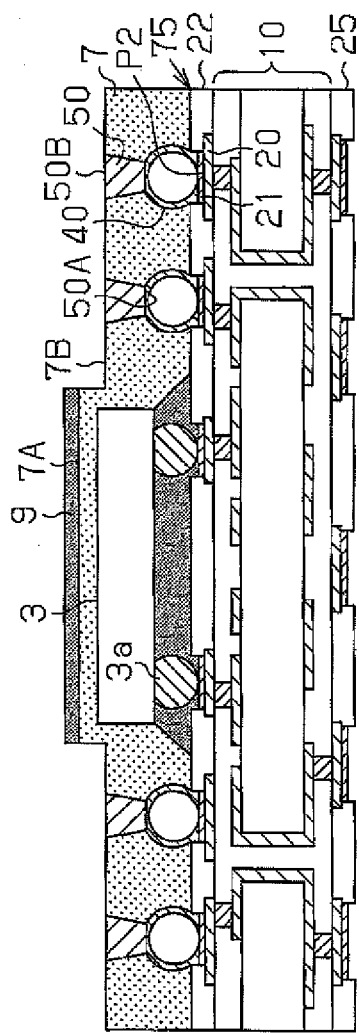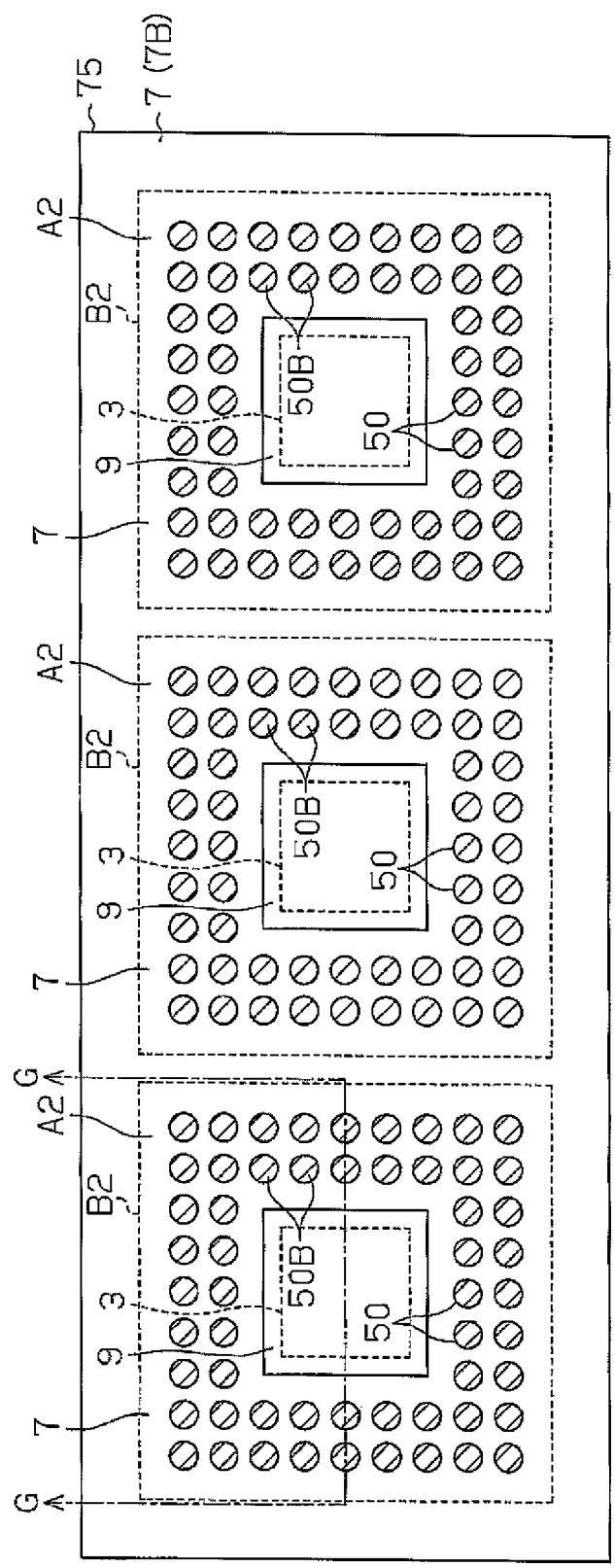
Fig.15A
Fig.15B

ELECTRONIC COMPONENT INCORPORATED SUBSTRATE AND METHOD FOR MANUFACTURING ELECTRONIC COMPONENT INCORPORATED SUBSTRATE

CROSS-REFERENCE TO RELATED APPLICATIONS

This application is based upon and claims the benefit of priority from prior Japanese Patent Application No. 2012-188798, filed on Aug. 29, 2012, the entire contents of which are incorporated herein by reference.

FIELD

This disclosure relates to an electronic component incorporated substrate and a method for manufacturing an electronic component incorporated substrate.

BACKGROUND

International Publication No. 2007/069606 describes one example of a semiconductor package. In the semiconductor package, electronic components are arranged between upper and lower substrates, and the surrounding of the electronic components is filled with an encapsulating resin. In such a semiconductor package, the upper substrate is fixed to the lower substrate with spacers arranged in between to maintain the distance between the upper and lower substrates. Under this situation, the encapsulating resin is filled between the upper and lower substrates.

A copper core solder ball may be used as the spacer. The copper core solder ball has a copper core ball and solder, which encompasses the copper core ball. The solder functions as a bonding material, and the copper core ball functions as a spacer. Solder reflow is performed under a situation in which copper core solder balls are arranged between connection pads of the upper substrate and connection pads of the lower substrate. This solder-bonds the connection pads of the upper substrate and the connection pads of the lower substrate. When the solder melts, the copper core balls are held between the connection pads of the upper substrate and the connection pads of the lower substrate and thereby function as spacers. Accordingly, the size of the copper core balls sets the distance between the upper substrate and the lower substrate, and keeps the distance constant.

SUMMARY

The size of the copper core solder balls is set taking into consideration the height of the electronic components arranged between the upper and lower substrates. Thus, an increase in the height of the electronic components enlarges the size of the copper core solder balls. Each copper core solder ball is spherical. Thus, enlargement of the copper core solder ball to increase the distance between the upper and lower substrates enlarges the dimensions of the copper core solder ball in the lateral direction (direction perpendicular to the stacking direction of the upper and lower substrates), that is, the diameter of the copper core solder ball. Larger copper core solder balls widen the minimum pitch between the solder balls. Accordingly, when the height of the electronic components increases, it becomes difficult to narrow the pitch between connection pads when wiring patterns are miniaturized between the upper and lower substrates.

One aspect of the present invention is an electronic component incorporated substrate including a first substrate, a second substrate, and a spacer unit that electrically connects the first substrate and the second substrate. An electronic component is mounted on the first substrate and arranged between the first substrate and the second substrate. A first encapsulating resin is formed between the first substrate and the second substrate to encapsulate the electronic component. A second encapsulating resin is formed on a first surface of the first encapsulating resin to fill a space between the first encapsulating resin and the second substrate. The spacer unit includes a stacked structure of a first solder ball, a metal post, and a second solder ball stacked in a stacking direction of the first substrate and the second substrate.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIGS. 5A to 5F are schematic cross-sectional views illustrating the method for manufacturing the electronic component incorporated substrate of FIG. 1;

FIG. 9 is a schematic plan view illustrating the method for manufacturing the electronic component incorporated substrate of FIG. 1;

FIG. 15A is a schematic cross-sectional view illustrating a method for manufacturing the electronic component incorporated substrate of FIG. 14;

FIG. 15B is a schematic plan view illustrating the method for manufacturing the electronic component incorporated substrate of FIG. 14;

DESCRIPTION OF THE EMBODIMENTS

Embodiments will now be described with reference to the drawings. To facilitate understanding, the drawings do not depict actual scale. Further, the cross-sectional views may not include hatching lines.

A first embodiment will now be described with reference to FIGS. 1 to 13C.

Figure 1:
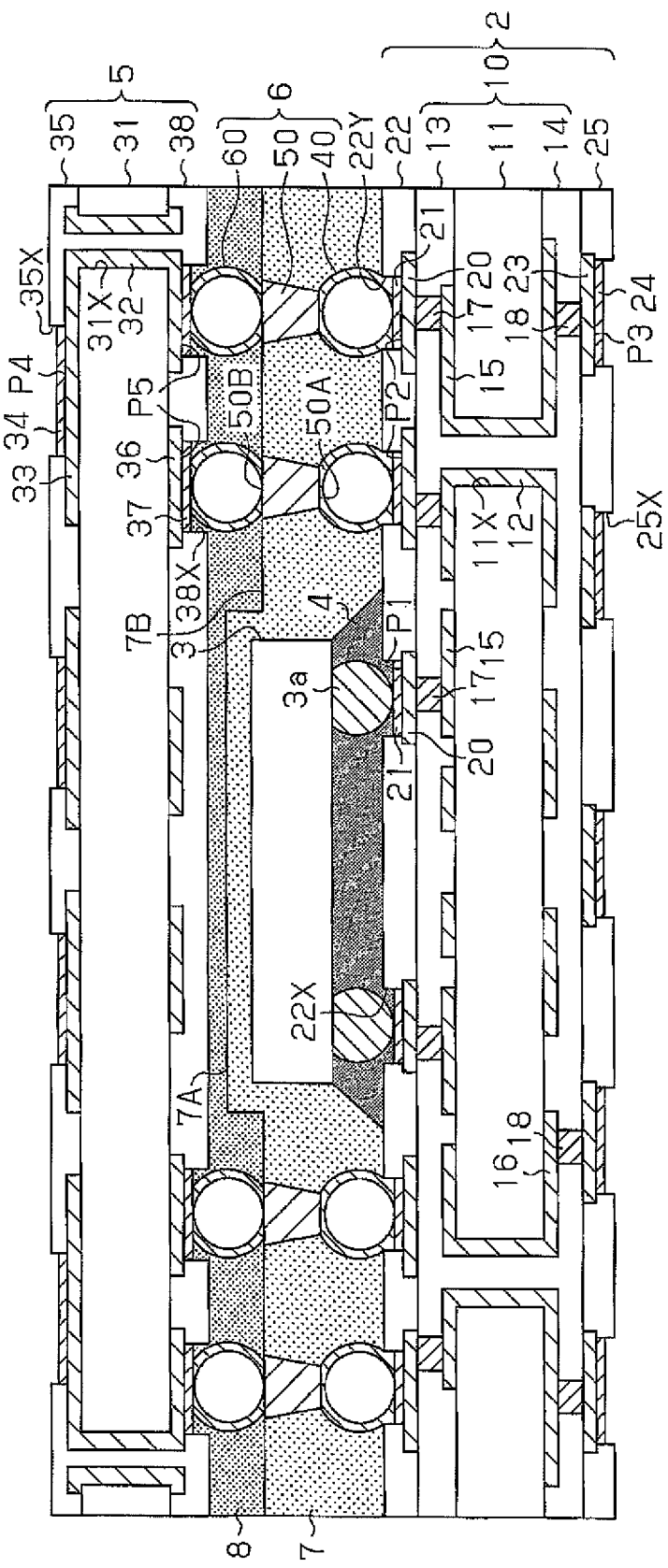
FIG. 1 is a schematic cross-sectional view illustrating a first embodiment of an electronic component incorporated substrate.

Referring to FIG. 1, an electronic component incorporated substrate 1 includes a first substrate 2, a semiconductor chip 3, an underfill resin 4, a second substrate 5, spacer units 6, and encapsulating resins 7 and 8.

The first substrate 2 includes a substrate body 10, a wiring pattern 20 of an uppermost layer, a metal layer 21, a solder resist layer 22, a wiring pattern 23 of a lowermost layer, a metal layer 24, and a solder resist layer 25.

The substrate body 10 includes a substrate core 11, through electrodes 12 formed in through holes 11X of the substrate core 11, insulation layers 13 and 14 stacked on the substrate core 11, wires 15 and vias 17 formed in the insulation layer 13, and wires 16 and vias 18 formed in the insulation layer 14. The through electrodes 12, the wires 15 and 16, and the vias 17 and 18 electrically connect the wiring pattern 20 and the wiring pattern 23. An insulative resin such as glass epoxy resin may be used as the material of the substrate core 11. Copper (Cu) or a copper alloy may be used as the material of the through electrodes 12, the wires 15 and 16, and the vias 17 and 18. An insulative resin such as epoxy resin or polyimide resin may be used as the material of the insulation layer 13 and 14.

The substrate core 11 includes a mounting surface (upper surface as viewed in FIG. 1) on which the semiconductor chip 3 is mounted. The wiring pattern 20 is arranged on the mounting surface of the substrate core 11. Copper or a copper alloy may be used as the material of the wiring pattern 20. The wiring pattern 20 functions as chip pads P1, which are electrically connected to bumps 3a of the semiconductor chip 3, and connection pads P2, which electrically connects the first substrate 2 and the second substrate 5. Although not illustrated in the drawings, when viewed from above, the chip pads P1 are arranged in the mounting region of the semiconductor chip 3 in, for example, a matrix array in correspondence with the layout of the bumps 3a of the semiconductor chip 3. Each chip pad P1 has, for example, a circular shape as viewed from above.

Figure 2:
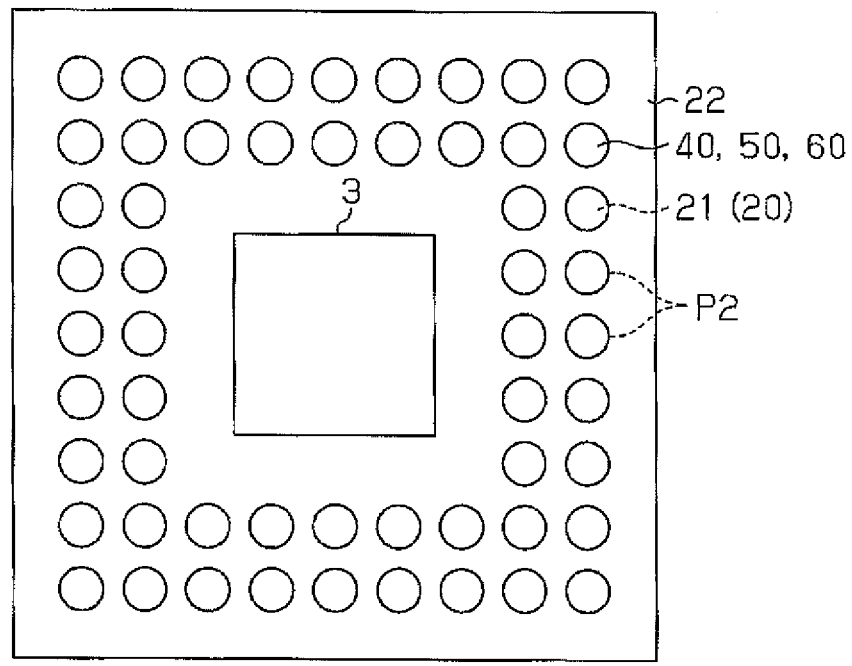
FIG. 2 is a schematic plan view illustrating the electronic component incorporated substrate of FIG. 1 with certain members removed from the electronic component incorporated substrate.

Referring to FIG. 2, the connection pads P2 are arranged in lines (here, two lines) surrounding the peripheral edge of the semiconductor chip 3. Each connection pad P2 has, for example, a circular shape as viewed from above. Certain members, such as the second substrate 5 and the encapsulating resins 7 and 8 of FIG. 1, are removed in FIG. 2.

As illustrated in FIG. 1, the solder resist layer 22 is arranged on the upper surface of the insulation layer 13 to cover portions of the wiring pattern 20. An insulative resin such as epoxy resin may be used as the material of the solder resist layer 22. The solder resist layer 22 includes a plurality of openings 22X and a plurality of openings 22Y. Each opening 22X exposes a portion of the wiring pattern 20 as a chip pad P1. Each opening 22Y exposes a portion of the wiring pattern 20 as a connection pad P2. The metal layer 21 is formed on the wiring pattern 20 exposed from the openings 22X and 22Y, that is, on the chip pads P1 and the connection pads P2. For example, the metal layer 21 may be formed by sequentially stacking a nickel (Ni) layer and a gold (Au) layer from the upper surface of the wiring pattern 20. The metal layer 21 may also be formed by sequentially stacking an Ni layer, a palladium (Pd) layer, and an Au layer from the upper surface of the wiring pattern 20. Alternatively, the metal layer 21 may be formed by sequentially stacking an Ni layer, a Pd layer, and a silver (Ag) layer from the upper surface of the wiring pattern 20 or by sequentially stacking an Ni layer, a Pd layer, an Ag layer, and an Au layer from the upper surface of the wiring pattern 20. The Ni layer is a metal layer of Ni or Ni alloy. The Au layer is a metal layer of Au or Au alloy. The Pd layer is a metal layer of Pd or Pd alloy. The Ag layer is a metal layer of Ag or Ag alloy. When the metal layer 21 is formed by an Ni layer and an Au layer, the Ni layer may have a thickness of approximately 0.05 to 5 μm, and the Au layer may have a thickness of approximately 0.01 to 1 μm. When the metal layer 21 covers the chip pad P1, the metal layer 21 functions as a chip pad. Further, when the metal layer 21 covers the connection pad P2, the metal layer 21 functions as a connection pad.

The wiring pattern 23 is arranged on a lower surface of the substrate body 10. The wiring pattern 23 includes connection pads P3. External connection terminals such as solder balls or lead pins used when mounting the first substrate 2 on a mounting substrate such as a motherboard are arranged on the external connection pads P3. Although not illustrated in the drawings, the external connection pads P3 are arranged in, for example, a matrix array as viewed from above. Each external connection pad P3 has, for example, a circular shape as viewed from above.

The solder resist layer 25 is arranged on the lower surface of the insulation layer 14 to cover portions of the wiring pattern 23. An insulative resin such as epoxy resin may be used as the material of the solder resist layer 25. The solder resist layer 25 includes a plurality of openings 25X. Each opening 25X exposes a portion of the wiring pattern 23 as an external connection pad P3. The metal layer 24 is formed on the wiring pattern 23 exposed from the openings 25X, that is, on the external connection pads P3. For example, the metal layer 24 may be formed by sequentially stacking an Ni layer and an Au layer from the lower surface of the wiring pattern 23. The metal layer 24 may also be formed by sequentially stacking an Ni layer, a Pd layer, and an Au layer from the lower surface of the wiring pattern 23. Alternatively, the metal layer 24 may be formed by sequentially stacking an Ni layer, a Pd layer, and an Ag layer from the lower surface of the wiring pattern 23 or by sequentially stacking an Ni layer, a Pd layer, an Ag layer, and an Au layer from the lower surface of the wiring pattern 23. When the metal layer 24 is formed by an Ni layer and an Au layer, the Ni layer may have a thickness of approximately 0.05 to 5 µm, and the Au layer may have a thickness of approximately 0.01 to 1 µm. When the metal layer 24 covers the external connection pad P3, the metal layer 24 functions as an external connection pad.

An organic solderbility preservative (OSP) treatment may be performed on the wiring pattern 23 exposed from each opening 25X to form an OSP film. In this case, an external connection terminal may be connected to the OSP film instead of the metal layer 24. Further, the wiring pattern 23 exposed from each opening 25X may be used as an external connection terminal. When the metal layer 24 or the OSP film is formed on the wiring pattern 23, the metal layer 24 or the OSP film may be used as the external connection terminal.

The semiconductor chip 3 is flip-chip mounted on the first substrate 2 having the above structure. In other words, the bumps 3a arranged on the circuit formation surface (lower surface as viewed in FIG. 1) of the semiconductor chip 3 are bonded to the metal layer 21 on the chip pads P1. This bonds the semiconductor chip 3 in a face-down state to the first substrate 2. The bumps 3a and the metal layer 21 electrically connect the semiconductor chip 3 to the chip pads P1 of the first substrate 2.

The semiconductor chip 3 may be logic chip such as a central processing unit (CPU) chip or a graphics processing unit (GPU) chip. The semiconductor chip 3 may also be a memory chip such as a dynamic random access memory (DRAM) chip, a static random access memory (SRAM) chip, or a flash memory. The semiconductor chip 3 may have the dimensions of, for example, approximately 3 mm×3 mm to 12 mm×12 mm as viewed from above. Further, the semiconductor chip 3 may have a thickness of, for example, approximately 50 to 100 µm.

Gold bumps or solder bumps may be used as the bumps 3a. Examples of the material for solder bumps include an alloy containing lead (Pb), an alloy of tin (Sn) and Au, an alloy of Sn and Cu, an alloy of Sn and Ag, and an alloy of Sn, Ag, and Cu. The bumps 3a may have a height of, for example, approximately 20 to 70 µm.

The semiconductor chip 3 is mounted on the first substrate 2. Instead, a different electronic component (e.g., capacitor or inductor) may be mounted on the first substrate 2.

The underfill resin 4 is arranged to fill the gap between the upper surface of the first substrate 2 and the lower surface of the semiconductor chip 3. The underfill resin 4 increases the connection strength between the bumps 3a and the chip pads P1 (metal layer 21), suppresses corrosion of the wiring pattern 20 and the generation of electromigration, and thereby prevents the reliability of the wiring pattern 20 and the metal layer 21 from decreasing. An insulative resin such as epoxy resin may be used as the material of the underfill resin 4.

The structure of the second substrate 5 will now be described. The second substrate 5 includes a substrate core 31, through electrodes 32 formed in through holes 31X of the substrate core 31, a wiring pattern 33 of an uppermost layer, a metal layer 34, a solder resist layer 35, a wiring pattern 36 of a lowermost layer, and a solder resist layer 38. The through electrodes 32 electrically connect the wiring pattern 33 and the wiring pattern 36. An insulative resin such as glass epoxy resin may be used as the material of the substrate core 31.

The substrate core 31 includes a mounting surface (upper surface as viewed in FIG. 1) on which an electronic component other than the semiconductor chip 3, such as another semiconductor chip or passive element, is mounted. The wiring pattern 33 is arranged on the mounting surface of the substrate core 31. Copper or a copper alloy may be used as the material of the wiring pattern 33. The wiring pattern 33 includes component connection pads P4, which are electrically connected to the electronic component other than the semiconductor chip 3. Each component connection pad P4 has, for example, a circular shape as viewed from above.

The solder resist layer 35 is arranged on the upper surface of the substrate core 31 to cover portions of the wiring pattern 33. An insulative resin such as epoxy resin may be used as the material of the solder resist layer 35. The solder resist layer 35 includes a plurality of openings 35X. Each opening 35X exposes a portion of the wiring pattern 33 as a component connection pad P4. The metal layer 34 is formed on the wiring pattern 33 exposed from the openings 35X, that is, on the component connection pads P4. For example, the metal layer 34 may be formed by sequentially stacking an Ni layer and an Au layer from the upper surface of the wiring pattern 33. The metal layer 34 may also be formed by sequentially stacking an Ni layer, a Pd layer, and an Au layer from the upper surface of the wiring pattern 33. Alternatively, the metal layer 34 may be formed by sequentially stacking an Ni layer, a Pd layer, and an Ag layer from the upper surface of the wiring pattern 33 or by sequentially stacking an Ni layer, a Pd layer, an Ag layer, and an Au layer from the upper surface of the wiring pattern 33. When the metal layer 34 is formed by an Ni layer and an Au layer, the Ni layer may have a thickness of approximately 0.05 to 5 µm, and the Au layer may have a thickness of approximately 0.01 to 1 µm. When the metal layer 34 covers the component connection pad P4, the metal layer 34 functions as a component connection pad.

The wiring pattern 36 is arranged on a surface (lower surface as viewed in FIG. 1) of the substrate core 31 opposite to the mounting surface. The wiring pattern 36 includes connection pads P5 that electrically connect the first substrate 2 and the second substrate 5. Each of the connection pads P5 is arranged opposing a corresponding one of the connection pads P2 formed on the first substrate 2. That is, the connection pads P5 are arranged in lines (here, two lines) surrounding the peripheral edge of the semiconductor chip 3 as viewed from above. Each connection pad P5 has, for example, a circular shape as viewed from above.

The solder resist layer 38 is arranged on the lower surface of the substrate core 31 to cover portions of the wiring pattern 36. An insulative resin such as epoxy resin may be used as the material of the solder resist layer 38. The solder resist layer 38 includes a plurality of openings 38X. Each opening 38X exposes a portion of the wiring pattern 36 as a connection pad P5. A metal layer 37 is formed on the wiring pattern 36 exposed from each opening 38X, that is, on each connection pad P5. For example, the metal layer 37 may be formed by sequentially stacking an Ni layer and an Au layer from the lower surface of the wiring pattern 36. The metal layer 37 may also be formed by sequentially stacking an Ni layer, a Pd layer, and an Au layer from the lower surface of the wiring pattern 36. Alternatively, the metal layer 37 may be formed by sequentially stacking an Ni layer, a Pd layer, and an Ag layer from the lower surface of the wiring pattern 36 or by sequentially stacking an Ni layer, a Pd layer, an Ag layer, and an Au layer from the lower surface of the wiring pattern 36. When the metal layer 37 is formed by an Ni layer and an Au layer, the Ni layer may have a thickness of approximately 0.05 to 5 µm, and the Au layer may have a thickness of approximately 0.01 to 1 µm. When the metal layer 37 covers the connection pad P5, the metal layer 37 functions as a connection pad.

A spacer unit 6 is bonded to each metal layer 37. The spacer unit 6 is also bonded to the corresponding connection pad P2

(metal layer 21) of the first substrate 2. In other words, each spacer unit 6 is arranged between the first substrate 2 and the second substrate 5. Further, each spacer unit 6 includes one end bonded to the metal layer 37 and another end bonded to the metal layer 21. The spacer unit 6 functions as a connection terminal that electrically connects the connection pad P2 of the first substrate 2 and the connection terminal P5 of the second substrate 5. Further, the spacer unit 6 functions as a spacer that maintains the distance (separated distance) between the first substrate 2 and the second substrate 5 at a specified value. The spacer units 6 have a height set to be greater than the total thickness of the semiconductor chip 3 and the bumps 3a. The spacer units 6 may have a height of, for example, 150 to 350 μm.

Each spacer unit 6 includes a stacked structure of a cored solder ball 40, a metal post 50, and a cored solder ball 60 that are stacked in the stacking direction of the first substrate 2 and the second substrate 5. In the present example, each of the cored solder balls 40 and 60 is a copper core solder ball. The metal post 50 is a rod-shaped connection terminal. The cored solder ball 40, the metal post 50, and the cored solder ball 60 are sequentially stacked from the upper surface of the metal layer 21.

Figure 3:
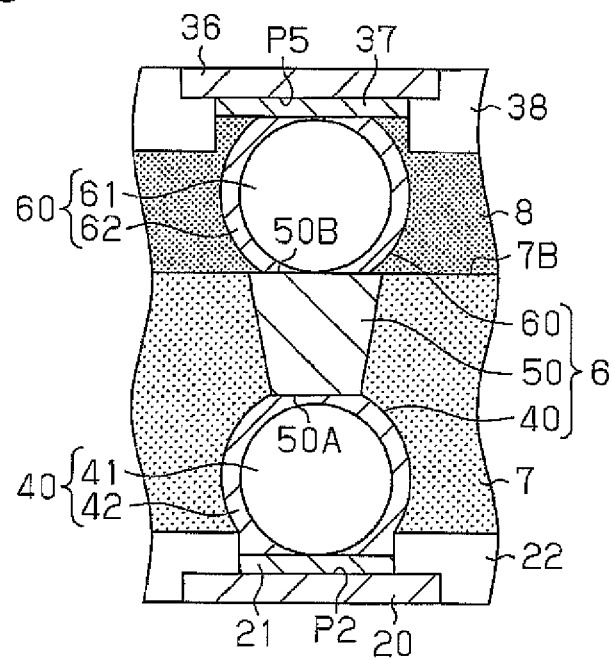
FIG. 3 is an enlarged cross-sectional view illustrating a spacer unit in the first embodiment.

Referring to FIG. 3, the cored solder ball 40 is bonded to the metal layer 21 on the corresponding connection pad P2. Accordingly, the metal layer 21 electrically connects the cored solder ball 40 to the connection pad P2. The cored solder ball 40 includes a spherical copper core ball 41 and solder 42, which encompasses the copper core ball 41. The solder 42 functions as a bonding material, and the copper core ball 41 functions as a spacer. That is, the solder 42 bonds the cored solder ball 40 to the metal layer 21 and the metal post 50. The copper core ball 41 may have a height (diameter) of approximately 50 to 100 μm. The cored solder ball 40 may have a height (diameter) of approximately 100 to 150 μm.

The metal post 50 includes a first surface (here, lower surface 50A) bonded to the cored solder ball 40 and a second surface (here, upper surface 50B) bonded to the cored solder ball 60. The metal post 50 extends downward from the cored solder ball 60. The metal post 50 may have, for example, a tapered shape with a diameter that decreases from the upper surface 50B toward the lower surface 50A. In other words, the metal post 50 of the present example has the shape of a generally truncated cone of which the upper surface 50B has a larger diameter than the lower surface 50A. The upper surface 50B of the metal post 50 is generally flush with a surface 7B that is a portion of an upper surface of the encapsulating resin 7. More specifically, the upper surface 50B of the metal post 50 is generally flush with the surface 7B of the encapsulating resin 7 that is in contact with a side wall of the metal post 50. The metal post 50 may have a height of, for example, approximately 50 to 100 μm. The upper surface 50B of the metal post 50 may have a diameter of, for example, approximately 50 to 100 μm. Copper or a copper alloy may be used as the material of the metal post 50.

The cored solder ball 60 is bonded to the upper surface 50B of the metal post 50 exposed from the encapsulating resin 7. Further, the cored solder ball 60 is bonded to the metal layer 37 on the connection pad P5. Accordingly, the metal layer 37 electrically connects the cored solder ball 60 to the connection pad P5. The cored solder ball 60 includes a spherical copper core ball 61 and solder 62, which encompasses the copper core ball 61. The solder 62 functions as a bonding material, and the copper core ball 61 functions as a spacer. That is, the solder 62 bonds the cored solder ball 60 to the metal post 50 and the metal layer 37. The copper core ball 61 may have a height (diameter) of, for example, approximately 50 to 100 μm. The cored solder ball 60 may have a height (diameter) of, for example, approximately 100 to 150 μm.

In the spacer unit 6 of the present example, the ratio of the height of the copper core ball 41 (or cored solder ball 40) to the height of the metal post 50 to the height of the copper core ball 61 (or cored solder ball 60) is set to be 1:1:1. However, the ratio is not limited to 1:1:1.

Referring to FIG. 1, the encapsulating resins 7 and 8 fill a gap or space between the first substrate 2 and the second substrate 5. The encapsulating resins 7 and 8 fix the second substrate 5 to the first substrate 2 and encapsulate the semiconductor chip 3. In other words, each of the encapsulating resins 7 and 8 functions as an adhesive that adheres the first substrate 2 and the second substrate 5. Further, each of the encapsulating resins 7 and 8 functions as a protective layer that protects the semiconductor chip 3.

The encapsulating resin 7 is formed in the space between the first substrate 2 and the second substrate 5 to seal (cover) the cored solder ball 40 and the side wall of the metal post 50 in the spacer unit 6 as well as to encapsulate the semiconductor chip 3. An insulative resin such as an epoxy resin and a polyimide resin may be used as the material of the encapsulating resin 7. Further, a resin material containing filler such as silica ($SiO_2$) mixed in an epoxy resin may be used as the material of the encapsulating resin 7. Instead of silica, an inorganic compound such as titanium oxide, aluminum oxide, aluminum nitride, silicon carbide, calcium titanate, zeolite, and the like or an organic compound may be used. Further, a molding resin formed through transfer molding, compression molding, and inkjet molding may be used as the encapsulating resin 7.

The encapsulating resin 8 is formed in the space between the encapsulating resin 7 and the second substrate 5 to seal (cover) the upper surface 50B of the metal post 50 and the cored solder ball 60 in the spacer unit 6. An insulative resin such as an epoxy resin and a polyimide resin may be used as the material of the encapsulating resin 8. Further, a resin material containing fillers such as silica ($SiO_2$) mixed in an epoxy resin may be used as the material of the encapsulating resin 8. Instead of silica, an inorganic compound such as titanium oxide, aluminum oxide, aluminum nitride, silicon carbide, calcium titanate, zeolite, and the like or an organic compound may be used. Further, a molding resin formed through transfer molding, compression molding, and inkjet molding may be used as the encapsulating resin 8.

The material of the encapsulating resin 8 may be a resin material having the same composition as the encapsulating resin 7 or a composition that differs from the encapsulating resin 7. For example, when a resin material containing fillers is used for the encapsulating resins 7 and 8, it is preferable that the filler contained in the encapsulating resin 8 have a smaller average grain diameter than that of the filler contained in the encapsulating resin 7 and the content amount of the filler in the encapsulating resin 8 be less than the content amount of the filler in the encapsulating resin 7. That is, it is preferable that the encapsulating resin 8 contain fillers each having a small average grain diameter (e.g., an average grain diameter of 5 to 6 μm) and the content amount of the filler be low (e.g., 70 wt % to 90 wt %). Such a resin material has a low thermal expansion coefficient. Thus, the thermal expansion coefficient of the encapsulating resin 7 may be approximated with that of the semiconductor chip 3 (e.g., silicon). This suppresses warping of the electronic component incorporated substrate 1 that would be caused by thermal stress. Thus, a resin material having a high content amount of filler is preferable as the encapsulating resin 7.

The operation of the electronic component incorporated substrate 1 will now be described.

Each spacer unit 6, electrically connecting the first substrate 2 and the second substrate 5, has a stacked structure of the cored solder ball 40, the metal post 50, and the cored solder ball 60 stacked in the stacking direction of the first substrate 2 and the second substrate 5. That is, the spacer unit 6 is formed by the stacked structure of three connection terminals (metal post 50 and cored solder balls 40 and 60). This allows for the diameter (that is, dimension in direction perpendicular to the stacking direction of substrates 2 and 5) of each connection terminal to be reduced in comparison with when the spacer unit 6 is formed with only one connection terminal (metal post or cored solder ball). A case in which the spacer units 6 hold the distance of 300 μm between the first substrate 2 and the second substrate 5 will now be described.

When the spacer unit 6 is formed by only one cored solder ball, the copper core ball has a diameter of 300 μm. In this case, the cored solder ball has a diameter of approximately 340 μm. When the interval between adjacent spacer units (cored solder balls) needs to be approximately 60 μm, the pitch between the spacer units (cored solder balls) is 400 (340+60) μm or greater. Further, when the spacer unit 6 is formed by only one metal post, and the metal post has an aspect ratio of 1, the metal post has a diameter (width) of 300 μm. In this case, the pitch between the spacer units (metal posts) is 360 (300+60) μm or greater.

In contrast, in the first embodiment, the spacer units 6 may have a pitch of approximately 200 μm. In detail, when setting the ratio of the height of the copper core ball 41 to the height of the metal post 50 to the height of the copper core ball 61 to 1:1:1 and setting the aspect ratio of the metal post 50 to 1, the height and diameter (width) of the metal post 50 is 100 μm, the diameter of each of the copper core balls 41 and 61 is 100 μm, and the diameter of each of the cored solder balls 40 and 60 is approximately 140 μm. When the interval between adjacent spacer units 6 needs to be approximately 60 μm, the pitch between the spacer units 6 may be approximately 200 (140+60) μm.

As described above, the dimension of each spacer unit 6 (that is, the dimension in direction perpendicular to the stacking direction of the substrates 2 and 5) may be reduced by forming each spacer unit 6 with the stacked structure of the cored solder ball 40, the metal post 50, and the cored solder ball 60 stacked in the stacking direction of the first substrate 2 and the second substrate 5. This allows for the minimum pitch to be narrowed in which the spacer units 6 are arranged.

With reference to FIGS. 4 to 13C, a method for manufacturing the electronic component incorporated substrate 1 will now be described.

Figure 4:
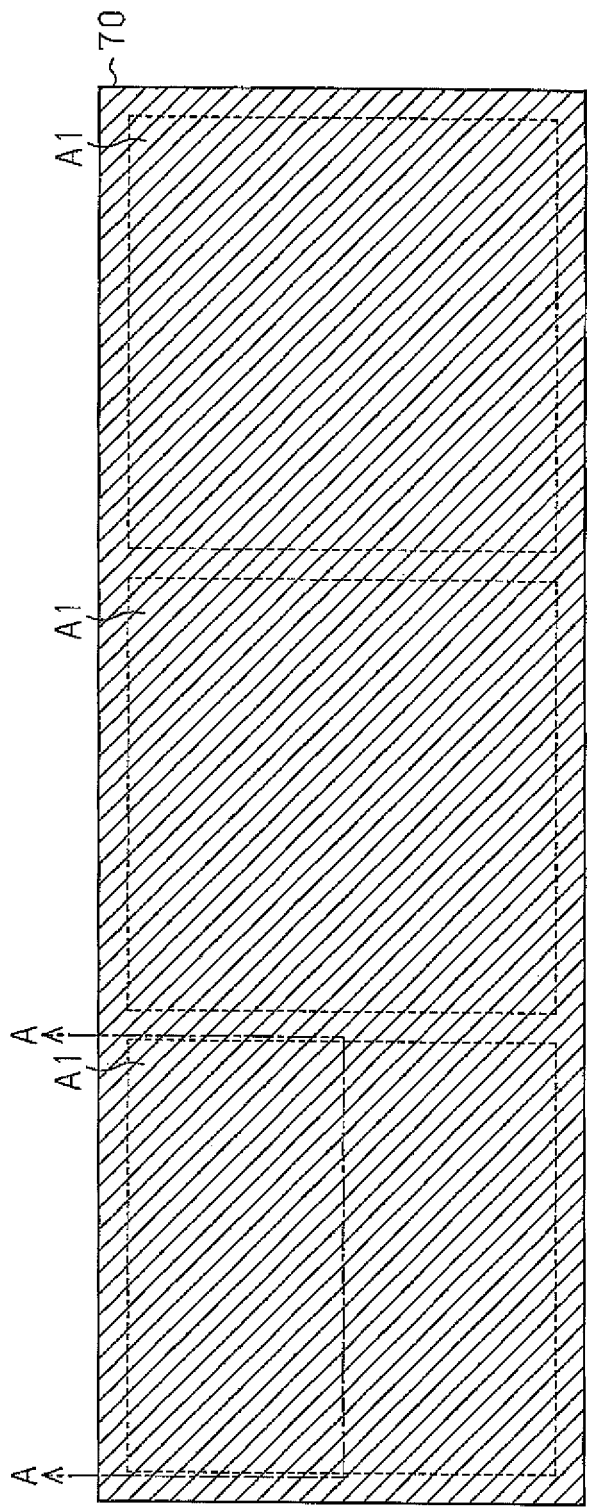
FIG. 4 is a schematic plan view illustrating a method for manufacturing the electronic component incorporated substrate of FIG. 1.

Referring to FIG. 4, a metal plate 70 is first prepared to form the metal posts 50. The metal plate 70 includes a plurality of (three in FIG. 4) regions A1. A plurality of metal posts 50 corresponding to a single electronic component incorporated substrate 1 are formed in each region A1. FIG. 5A illustrates a cross-sectional structure of the metal plate 70. The metal plate 70 may have a thickness of, for example, approximately 150 to 250 μm. Copper or a copper alloy may be used as the material of the metal plate 70. To facilitate illustration, FIGS. 5A to 5F illustrate the cross-sectional structure of the metal plate 70 for a single region A1. FIGS. 5A to 5D illustrate the cross-sectional structure of the metal plate 70 during a manufacturing process taken along line A-A in FIG. 4, and FIGS. 5E and 5F illustrate the cross-sectional structure of the metal plate 70 during a manufacturing process taken along line B-B in FIG. 6A.

In the step illustrated in FIG. 5B, a resist layer 71 is formed to entirely cover a surface 70A of the metal plate 70, and a resist layer 72 is formed to entirely cover a surface 70B of the metal plate 70. In the step illustrated in FIG. 5C, openings 71X are formed in the resist layer 71 leaving the resist layer 71 at certain locations (locations where the metal posts 50 are formed). Further, an opening 72X is formed in the resist layer 72. The opening 72X corresponds to the mounting region of the semiconductor chip 3 mounted on the first substrate 2. Taking into consideration the etching process performed in the next step, the materials of the resist layers 71 and 72 may be resistant to etching. For example, a photosensitive dry film resist or a liquid photoresist (e.g., dry film resist or liquid photoresist such as novolac resin or acrylic resin or liquid resist) may be used as the material of the resist layers 71 and 72. When using, for example, a photosensitive dry film resist, thermal compression bonding is performed to laminate a dry film on both of the surfaces 70A and 70B of the metal plate 70, and the dry film laminated on the surfaces 70A and 70B of the metal plate 70 is exposed and developed. This patterns the dry film and forms the openings 71X and 72X. As a result, the resist layer 71 including the openings 71X is formed on the surface 70A of the metal plate 70, and the resist layer 72 including the opening 72X is formed on the surface 70B of the metal plate 70. When using a liquid photoresist, the same step may be performed to form the resist layers 71 and 72.

Then, in the step illustrated in FIG. 5D, etching is performed on the surfaces 70A and 70B of the metal plate 70 using the resist layers 71 and 72 as etching masks. That is, etching is performed on the surface 70A of the metal plate 70 exposed from the openings 71X of the resist layer 71 and the surface 70B exposed from the opening 72X of the resist layer 72. This forms recesses 70X in portions of the metal plate 70 exposed from the openings 71X. In other words, portions of the metal plate 70 covered by the resist layer 71 form projections 73. Each projection 73 includes a surface 73A (first surface) formed by the surface 70A of the metal plate 70. Each recess 70X includes a bottom surface 70C formed at a lower position than the surface 73A of the projection 73 (i.e., surface 70A of the metal plate 70). The portion of the metal plate 70 exposed from both openings 71X and 72X forms an opening 70Y. Each projection 73 serves as a base material for a metal post 50. When the metal plate 70 is mounted on and fixed to the first substrate 2, the opening 70Y prevents the metal plate 70 from interfering with the semiconductor chip 3.

For example, when patterning the metal plate 70 through wet etching (isotropic etching), the etching liquid used for the wet etching may be selected in accordance with the material of the metal plate 70. For example, when using copper as the metal plate 70, aqueous ferric chloride may be used as the etching liquid. In this case, spray etching may be performed from the surfaces 70A and 70B of the metal plate 70 to form the recesses 70X and the opening 70Y. In this manner, when the recesses 70X are formed in the metal plate 70 by performing the wet etching, a side etching effect occurs and advances etching in the planar direction of the metal plate 70. This forms the projections 73 with a trapezoidal cross-section. Such an etching process allows for the formation of the recesses 70X (projections 73) and the opening 70Y. However, a stamping process may be performed to form the recesses 70X (projections 73) and the opening 70Y.

Figure 6:
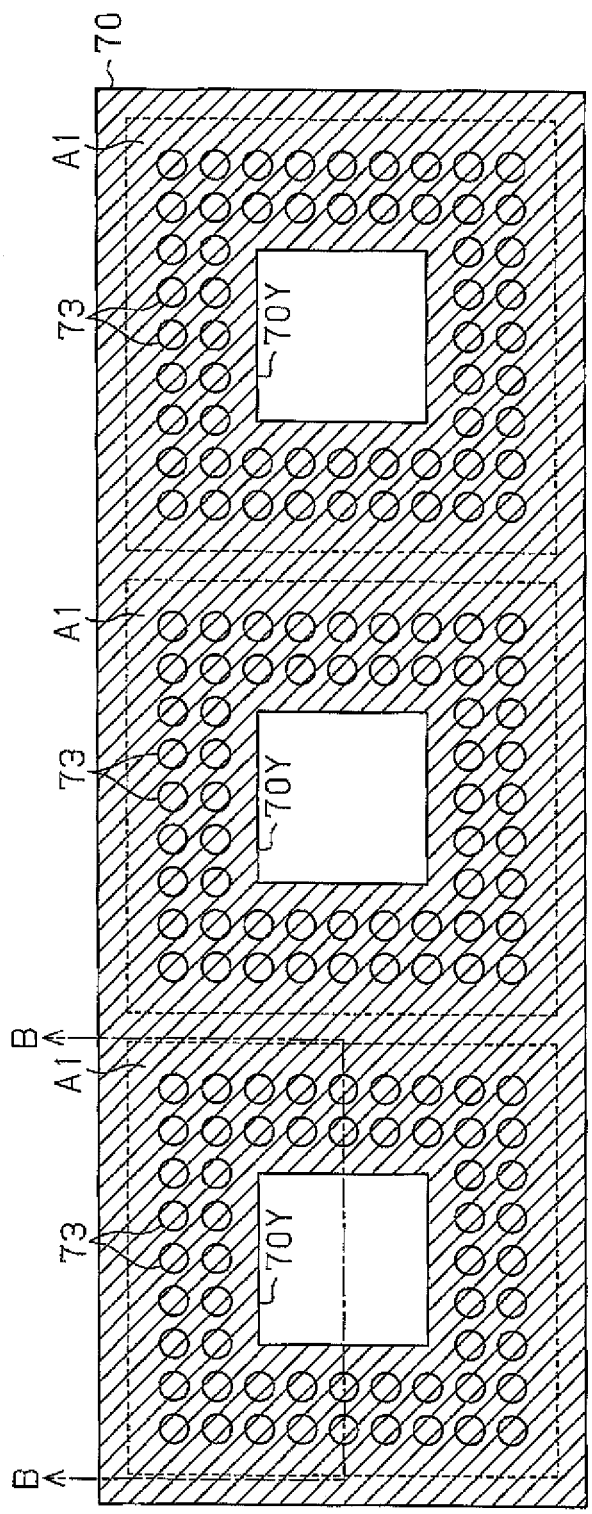
FIGS. 6 and 7 are schematic plan views illustrating the method for manufacturing the electronic component incorporated substrate of FIG. 1.

In the step illustrated in FIG. 5E, the resist layers 71 and 72 illustrated in FIG. 5D are removed with an alkali defoliation liquid. This arranges the projections 73 in two lines along the peripheral edge (illustrated by broken lines) of the opening 70Y in each region A1 as illustrated in FIG. 6.

In the step illustrated in FIG. 5F, the cored solder ball 40 is bonded to the surface 73A (first surface) of each projection 73. The cored solder ball 40 may be mounted after applying flux to the surface 73A of each projection 73. Then, a reflow process is performed at a temperature of approximately 230° C. to 260° C. to fix the cored solder ball 40 to the surface 73A of the projection 73. Then, the surface is washed to remove the flux.

Figure 7:
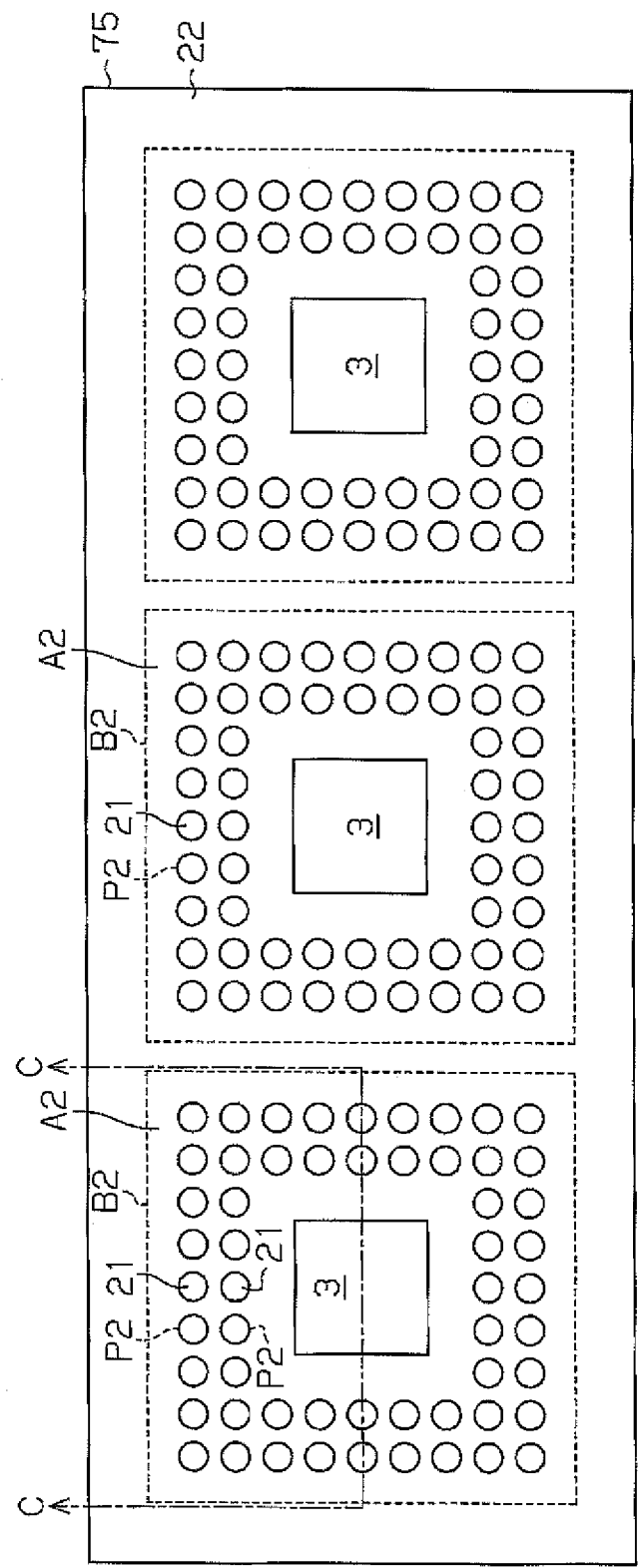

Referring to FIG. 7, a first substrate material 75 (hereinafter, simply referred to as the substrate material 75) for forming the first substrate 2 is prepared. The substrate material 75 is a single material used to form a plurality of the first substrates 2. The substrate material 75 includes a plurality of (three in this case) substrate formation regions A2. The first substrate 2 is formed in each substrate formation region A2. The substrate material 75 is slightly larger than the metal plate 70. FIG. 7 illustrates a structure corresponding to the first substrate 2 in each substrate formation region A2, that is, a situation in which many connection pads P2 and the metal layer 21 are formed on the upper side of each substrate formation region A2. Further, the semiconductor chip 3 is mounted on the upper surface of each substrate formation region A2. The substrate material 75 is cut along cutting lines B2 in a subsequent step by a dicing blade or the like. This singulates structures, each corresponding to the first substrate 2. The structure corresponding to the first substrate 2 may be manufactured through a known method, which will now be described with reference to FIGS. 8A and 8B. FIGS. 8A to 8D, 10A, 10B, and 13A to 13C illustrate the cross-sectional structure of the substrate material 75 at only one substrate formation region A2 to facilitate description.

Figure 8A:
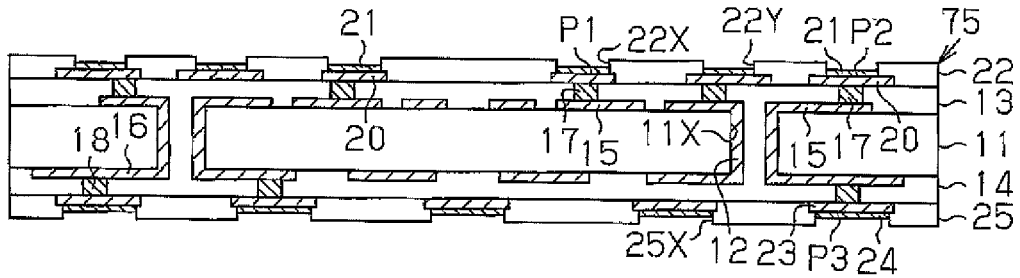
FIGS. 8A to 8D are schematic cross-sectional views illustrating the method for manufacturing the electronic component incorporated substrate of FIG. 1.
Figure 8B:
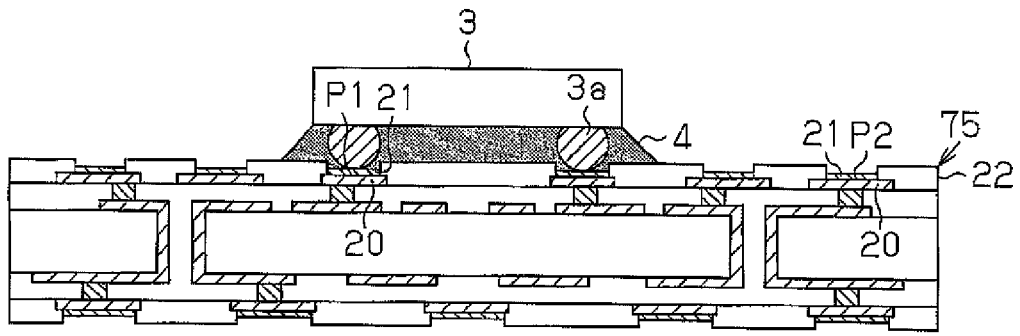

FIGS. 8A and 8B illustrate the cross-sectional structure of the substrate material 75 taken along line C-C in FIG. 7 during the manufacturing process. First, in the step illustrated in FIG. 8A, the through holes 11X are formed at certain locations in the substrate core 11. Then, a plating is applied to the wall surfaces of the through holes 11X to form the through electrodes 12. This forms an electrically conductive path between the upper and lower surfaces of the substrate core 11. Then, a subtractive process, for example, is performed to form the wires 15 and 16. Further, a resin film vacuum-laminated to the upper and lower surfaces of the substrate core 11 is heated and cured to form the insulation layers 13 and 14. The insulation layers 13 and 14 may be formed by applying and heating a paste or liquid of resin. Then, openings are formed in the insulation layers 13 and 14. If necessary, a desmearing process is performed. Then, a semi-additive process, for example, is performed to form the vias 17 and 18 and the wiring patterns 20 and 23. Next, the solder resist layer 22 is formed including the openings 22X and 22Y that expose portions of the wiring pattern 20 as the chip pads P1 and the connection pads P2. Further, the solder resist layer 25 is formed including the openings 25X that expose portions of the wiring pattern 23 as the external connection pads P3. Then, the metal layer 21 is formed on the chip pads P1 and the connection pads P2 and the metal layer 24 is formed on the external connection pads P3 by performing, for example, electroless plating.

In the step illustrated in FIG. 8B, the bumps 3a of the semiconductor chip 3 are flip-chip bonded to the metal layer 21 on the chip pads P1. That is, the semiconductor chip 3 is flip-chip mounted on the substrate formation region A2 of the substrate material 75. Subsequently, the underfill resin 4 is filled between the semiconductor chip 3 and the solder resist layer 22. In this manner, a structure corresponding to the first substrate 2 is formed in each substrate formation region A2 of the substrate material 75.

Figure 8C:
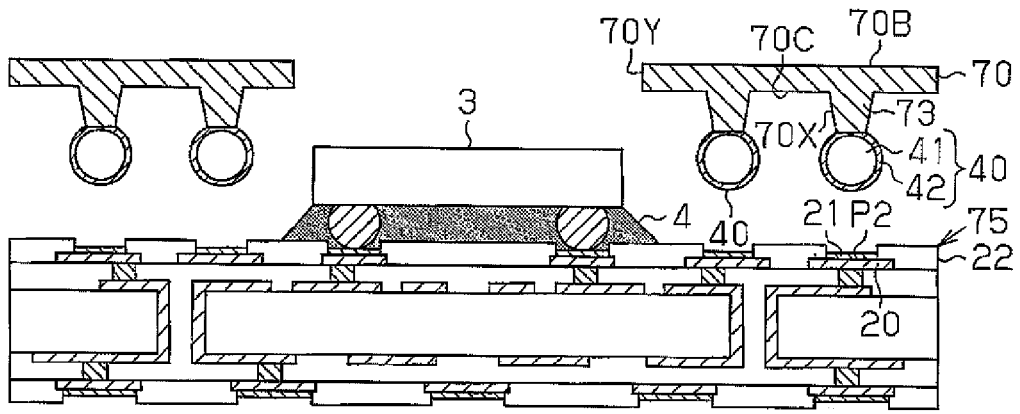
Figure 8D:
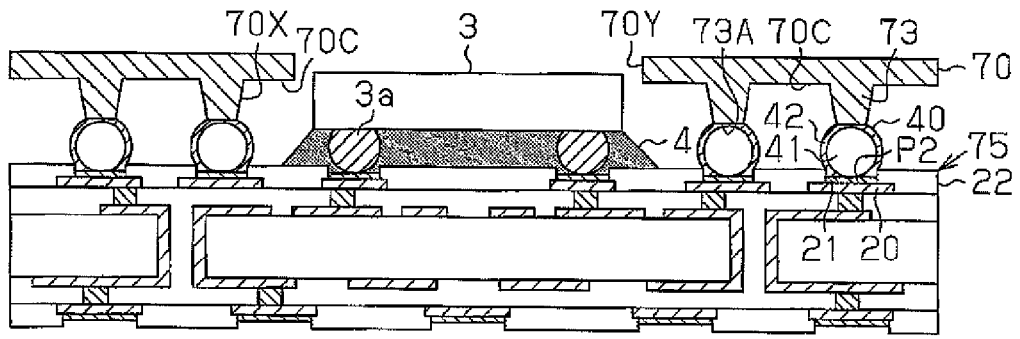

FIGS. 8C and 8D illustrate a cross-sectional structure of the substrate material 75 and the metal plate 70 taken along line D-D in FIG. 9 during the manufacturing process. In the step illustrated in FIG. 8C, the metal plate 70, including the projections 73 to which the cored solder balls 40 are bonded, is arranged above the substrate material 75. Here, as illustrated in FIG. 9, the metal plate 70 and the substrate material 75 are positioned so that the three regions A1 of the metal plate 70 are vertically aligned with the three substrate formation regions A2 of the substrate material 75. More specifically, as illustrated in FIG. 8C, the metal plate 70 and the substrate material 75 are positioned so that the upper surface of the solder resist layer 22 of the substrate material 75 opposes the bottom surface 70C of each recess 70X in the metal plate 70 and so that the cored solder balls 40 are opposed to the connection pads P2 (metal layer 21)

In the step illustrated in FIG. 8D, the cored solder balls 40 bonded to the surfaces 73A of the projections 73 are bonded to the metal layer 21 on the connection pads P2. More specifically, flux is first applied to the upper surface of the metal layer 21 on the connection pads P2. Then, as illustrated in FIG. 8D, the metal plate 70 is arranged on the substrate material 75 with the cored solder balls 40 located in between. Then, the metal plate 70 and the substrate material 75, which are stacked together, are heated in a reflow furnace to a temperature of approximately 230° C. to 260° C. This melts solder 42 of each cored solder ball 40 and bonds the cored solder balls 40 to the metal layer 21 on the connection pads P2. In this manner, the metal plate 70 is fixed to the substrate material 75. Here, as illustrated in FIG. 9, the opening 70Y that is larger than the size of the semiconductor chip 3 is formed in the metal plate 70 at a location corresponding to the mounting region of the semiconductor chip 3. Thus, the semiconductor chip 3 and the metal plate 70 are not overlapped with each other as viewed from above. Thus, even though portions of the metal plate 70 other than the projections 73 (e.g., bottom surface 70C of each recess 70X) are located at positions lower than the upper surface of the semiconductor chip 3 as illustrated in FIG. 8D, interference (contact) of the metal plate 70 with the semiconductor chip 3 is suppressed. Thus, the total height of the copper core balls 41 (cored solder balls 40) and the projections 73 may be set to be less than the total thickness of the semiconductor chip 3 and the bumps 3a. In the present step, when the reflow process is performed while forcing the metal plate 70 against the substrate material 75, the copper core ball 41 of each cored solder ball 40 functions as a spacer, and the interval between the metal plate 70 and the substrate material 75 is maintained at a given distance.

Figure 10A:
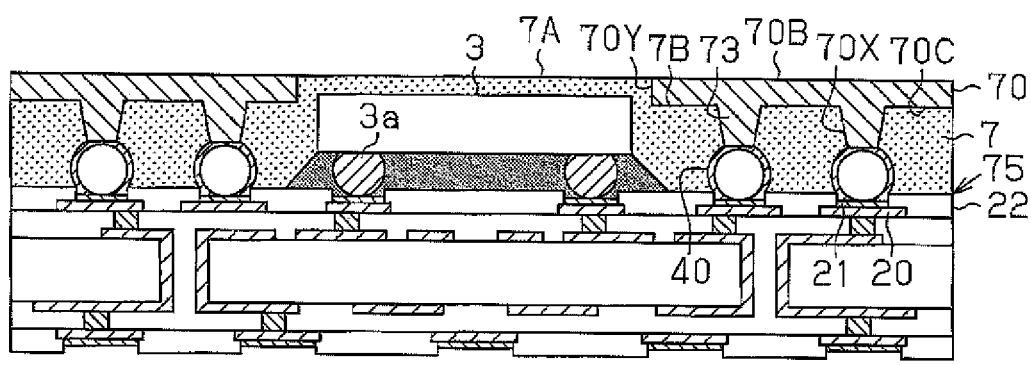
FIGS. 10A and 10B are schematic cross-sectional views illustrating the method for manufacturing the electronic component incorporated substrate of FIG. 1.
Figure 10B:
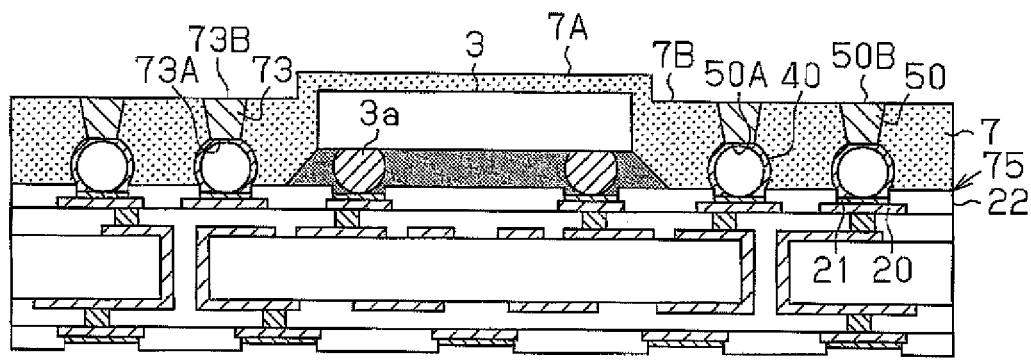

FIG. 10A illustrates the cross-sectional structure of the substrate material 75 and the metal plate 70 taken along line D-D in FIG. 9 during the manufacturing process. FIG. 10B illustrates the cross-sectional structure of the substrate material 75 taken along line E-E in FIG. 11 during the manufacturing process. In the step illustrated in FIG. 10A, the encapsulating resin 7 is formed to fill the space between the metal plate 70 and the substrate material 75 and to encapsulate the semiconductor chip 3 mounted on the substrate material 75. More specifically, the encapsulating resin 7 is formed on the solder resist layer 22 to seal (cover) the cored solder balls 40 and the projections 73 and to encapsulate the semiconductor chip 3. The encapsulating resin 7 fills the opening 70Y of the metal plate 70 and exposes the surface 70B of the metal plate 70 to the exterior. When the encapsulating resin 7 fills the opening 70Y, the encapsulating resin 7 includes a surface 7A that is generally flush with the surface 70B of the metal plate 70.

The surface 7A of the encapsulating resin 7 is located in a region where the encapsulating resin 7 covers the semiconductor chip 3. The surface 7B of the encapsulating resin 7 outside the region covering the semiconductor chip 3 is in contact with the bottom surface 70C of each recess 70X of the metal plate 70. The surface 7B of the encapsulating resin 7 is located in a region where the encapsulating resin 7 covers the cored solder balls 40 and the side walls of the projections 73 (i.e., metal posts 50). That is, the upper surface (first surface) of the encapsulating resin 7 includes the surface 7A (second surface) and the surface 7B (third surface). A step is formed by the surfaces 7A and 7B. The encapsulating resin 7 rigidly fixes the metal plate 70 to the substrate material 75.

For example, when using a thermosetting molding resin as the material of the encapsulating resin 7, the structure illustrated in FIG. 8D is arranged in a molding die, pressure (e.g., 5 to 10 MPa) is applied to the interior of the molding die, and a flux of the molding resin is charged into the molding die. Then, the resin is heated to, for example, approximately 180° C. and cured to form the encapsulating resin 7. When charging the molding resin, for example, transfer molding, compression molding, and inkjet molding may be performed.

A semi-cured resin sheet may be used in lieu of the molding resin. In this case, the structure illustrated in FIG. 8D and the semi-cured resin sheet arranged on the upper side of the structure are arranged between upper and lower plates. A pressing machine or the like pressurizes the upper and lower plates while heating the resin sheet. This forms the encapsulating resin 7. In this case, the pressurizing and heating process melts the resin sheet. The melted resin fills the space between the metal plate 70 and the substrate material 75 as the encapsulating resin 7. This exposes the surface 70B of the metal plate 70.

Figure 11:
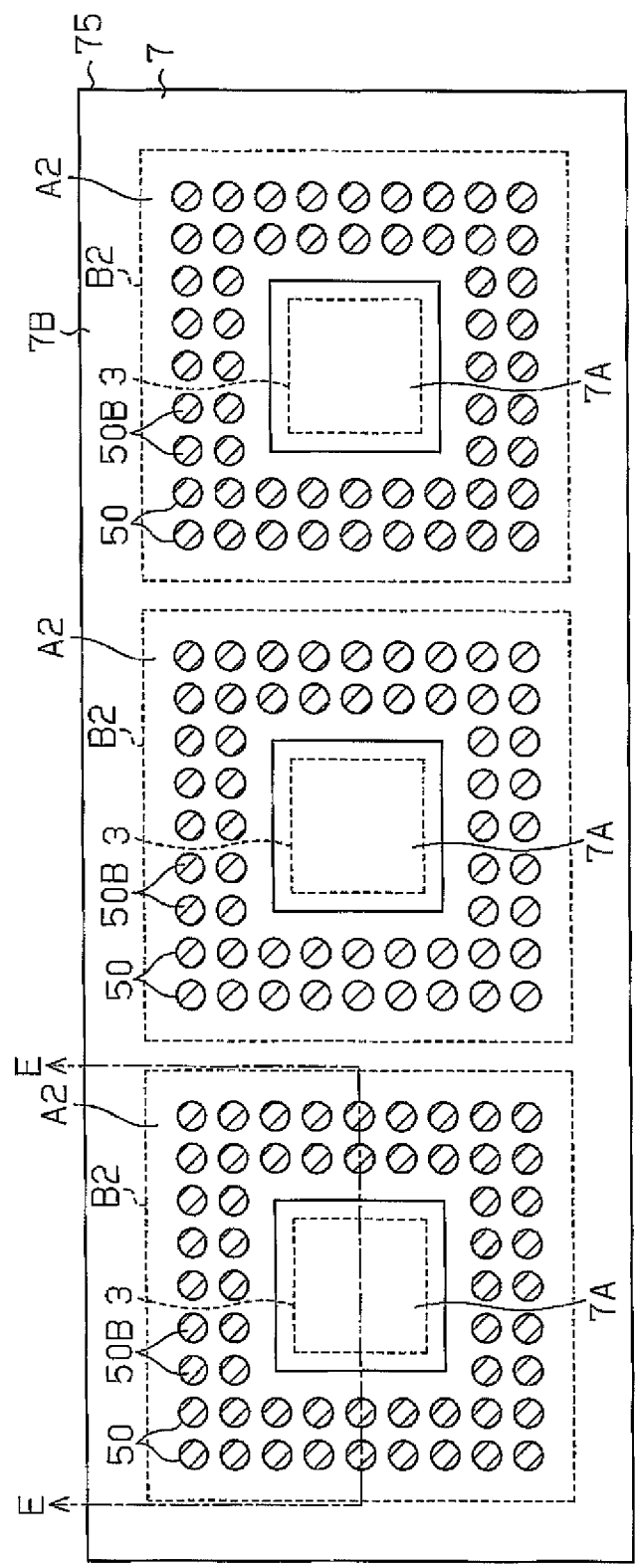
FIG. 11 is a schematic plan view illustrating the method for manufacturing the electronic component incorporated substrate of FIG. 1.

Half etching is performed using the encapsulating resin 7 as an etching mask to thin the metal plate 70 to a certain depth. This forms the metal posts 50 as illustrated in FIG. 10B. The metal plate 70 is thinned until portions of the metal plate other than the projections 73 illustrated in FIG. 10A are removed. That is, the metal plate 70 is thinned until the surfaces 73B, which are opposite to the surfaces 73A of the projections 73, are exposed from the encapsulating resin 7. More specifically, the metal plate 70 is thinned until the upper surfaces 50B of the metal posts 50 are generally flush with the surface 7B of the encapsulating resin 7. This forms the metal posts 50 of which side walls are covered by the encapsulating resin 7 and upper surfaces 50B are exposed from the encapsulating resin 7 as illustrated in FIG. 11. For example, when performing wet etching (isotropic etching) to thin the metal plate 70, the etching liquid used for the wet etching may be selected in accordance with the material of the metal plate 70. For example, when using copper as the metal plate 70, aqueous ferric chloride may be used as the etching liquid. In this case, spray etching may be performed from the upper surface side of the metal plate 70 to form the metal posts 50. In this step, the encapsulating resin 7 functions as a protective layer that protects the projections 73 so that the side surfaces of the projections 73 (metal posts 50) are not removed by the etching.

Figure 12A:
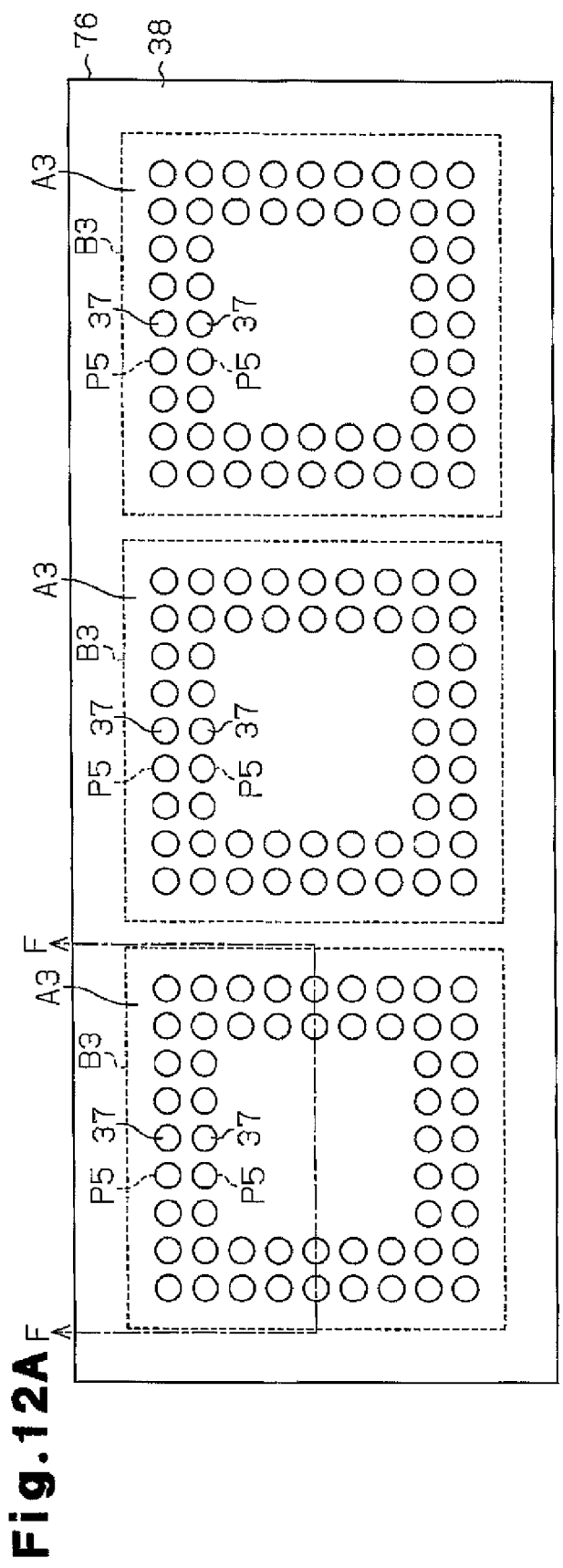
FIG. 12A is a schematic plan view illustrating the method for manufacturing the electronic component incorporated substrate of FIG. 1.
Figure 12B:
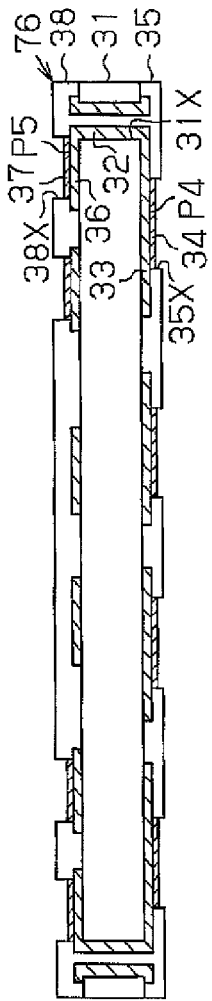
FIGS. 12B, 12C, and 13A to 13C are schematic cross-sectional views illustrating the method for manufacturing the electronic component incorporated substrate of FIG. 1.
Figure 12C:

Referring to FIG. 12A, a second substrate material 76 (hereinafter, simply referred to as the substrate material 76) for forming the second substrate 5 is prepared. The substrate material 76 is a single material used to form a plurality of the second substrates 5. The substrate material 76 includes a plurality of (three in this case) substrate formation regions A3. The second substrate 5 is formed in each substrate formation region A3. FIG. 12A illustrates a structure corresponding to the second substrate 5 in each substrate formation region A3, that is, a situation in which many connection pads P5 and the metal layer 37 are formed on the lower side of each substrate formation region A3. The substrate material 76 is cut along cutting lines B3 in a subsequent step by a dicing blade or the like. This singulates structures, each corresponding to the second substrate 5. The structure corresponding to the second substrate 5 may be manufactured through a known method, which will now be described with reference to FIG. 12B. FIGS. 12B, 12C, and 13A to 13C illustrate the cross-sectional structure of the substrate material 76 at only one substrate formation region A3 during the manufacturing process to facilitate description. FIGS. 12B and 12C illustrate the cross-sectional structure of the substrate material 76 taken along line F-F in FIG. 12A during the manufacturing process.

Referring to FIG. 12B, first, the through holes 31X are formed at certain locations in the substrate core 31. Then, a plating is applied to the wall surfaces of the through holes 31X to form the through electrodes 32. This forms an electrically conductive path between the upper and lower surfaces of the substrate core 31. Then, a subtractive process, for example, is performed to form the wiring patterns 33 and 36. Next, the solder resist layer 35 is formed including the openings 35X that expose portions of the wiring pattern 33 as the component connection pads P4. Further, the solder resist layer 38 is formed including the openings 38X that expose portions of the wiring pattern 36 as the connection pads P5. Then, electroless plating, for example, is performed to form the metal layer 34 on the component connection pads P4 and form the metal layer 37 on the connection pads P5. In this manner, a structure corresponding to the second substrate 5 is formed in each substrate formation region A3 of the substrate material 76.

In the step illustrated in FIG. 12C, the cored solder balls 60 are bonded to the metal layer 37. The cored solder balls 60 may be mounted after applying flux to the metal layer 37. Then, a reflow process is performed at a temperature of approximately 230° C. to 260° C. to fix the cored solder balls 60 to the metal layer 37. Then, the surface is washed to remove the flux.

Figure 13A:
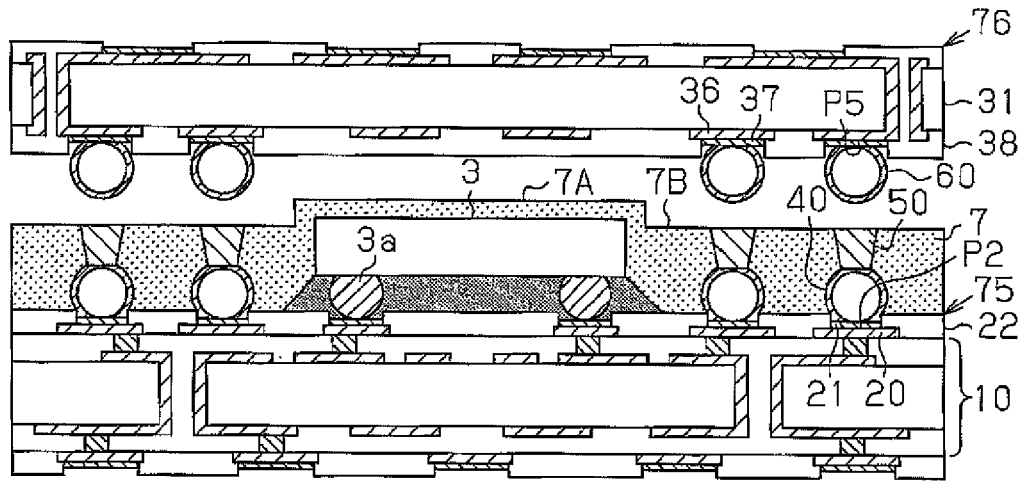

In the step illustrated in FIG. 13A, the structure illustrated in FIG. 12C (second substrate material 76) is arranged above the structure illustrated in FIG. 10B (first substrate material 75). Here, the two substrate materials 75 and 76 are positioned so that the three substrate formation regions A2 of the first substrate material 75 (refer to FIG. 11) are vertically aligned with the three substrate formation regions A3 (refer to FIG. 12A) of the second substrate material 76. More specifically, the two substrate materials 75 and 76 are positioned so that the upper surface (surfaces 7A and 7B) of the encapsulating resin 7 formed on the first substrate material 75 are opposed to the lower surface of the solder resist layer 38 of the second substrate material 76, and so that the cored solder balls 60 (connection pads P5) are opposed to the metal posts 50 (connection pads P2).

Figure 13B:
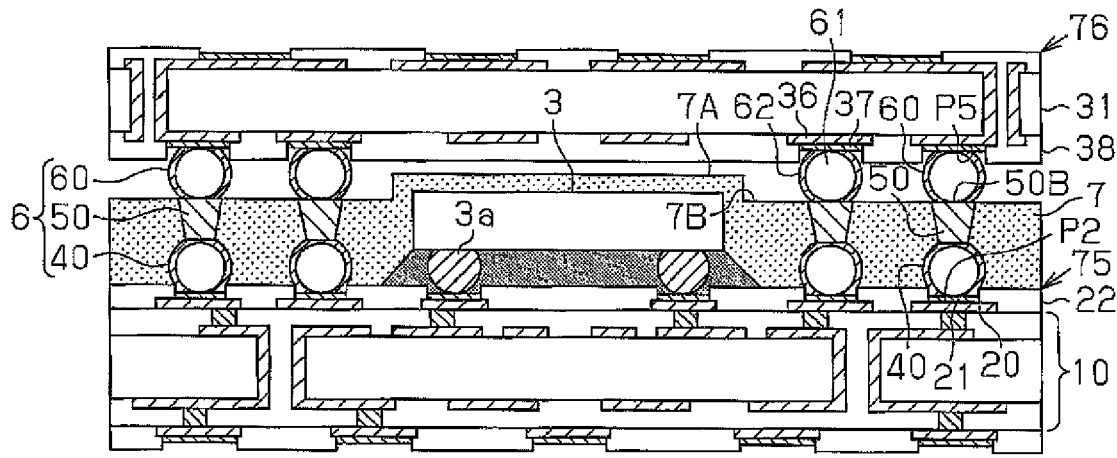

In the step illustrated in FIG. 13B, the cored solder balls 60 are bonded to the upper surfaces 50B of the metal posts 50 that form pads. For example, after applying flux to the upper surfaces 50B of the metal posts 50, the second substrate material 76 is arranged above the encapsulating resin 7 formed on the first substrate material 75 with the cored solder balls 60 arranged in between. The cored solder balls 60 form a gap (space) between the encapsulating resin 7 and the second substrate material 76. The substrate material 75 and the substrate material 76, which are stacked together as described above, are heated to a temperature of approximately 230° to 260° C. in a reflow furnace. This melts the solder 62 of each cored solder ball 60, and bonds the cored solder balls 60 to the metal posts 50. In this manner, each spacer unit 6 is formed by sequentially stacking the cored solder ball 40, the metal post 50, and the cored solder ball 60. The spacer units 6 fix the second substrate material 76 to the first substrate material 75. In this step, when the reflow process is performed while forcing the second substrate material 76 against the first substrate material 75, the copper core ball 61 of the cored solder ball 60, the metal post 50, the copper core ball 41 of the cored solder ball 40, and the encapsulating resin 7 function as a spacer. This maintains a given distance between the two substrate materials 65 and 66.

Figure 13C:
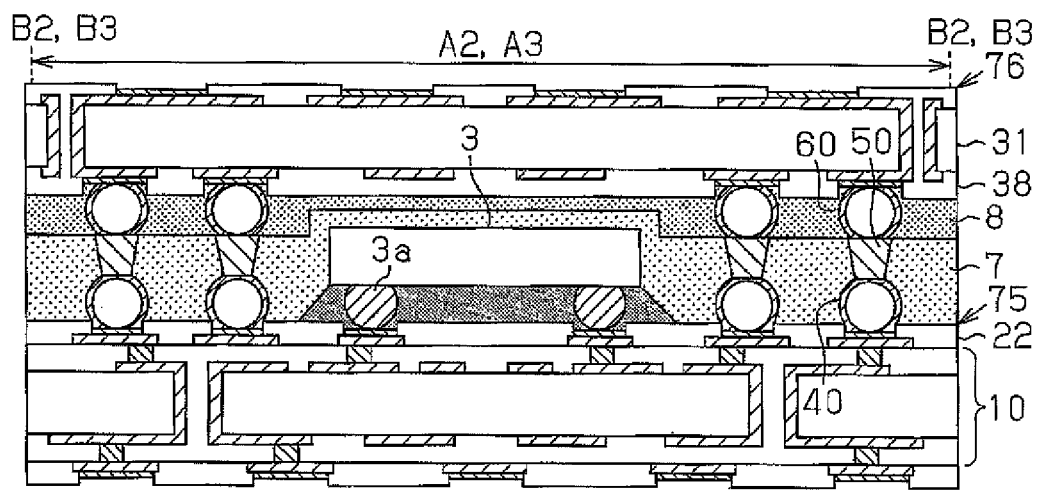

In the step illustrated in FIG. 13C, the encapsulating resin 8 is formed to fill the space between the two substrate materials 75 and 76, that is, the space between the encapsulating resin 7 and the substrate material 76. The encapsulating resin 8 rigidly fixes the substrate material 75 and the substrate material 76 to each other. For example, when using a thermosetting molding resin as the material of the encapsulating resin 8, the structure illustrated in FIG. 13B is arranged in a molding die, pressure (e.g., 5 to 10 MPa) is applied to the interior of the molding die, and a flux of the molding resin is charged into the molding die. Then, the resin is heated to, for example, approximately 180° C. and cured to form the encapsulating resin 8. The molding resin may be charged through, for example transfer molding, compression molding, and inkjet molding.

The above manufacturing steps manufacture the structure corresponding to the electronic component incorporated substrate 1 in the substrate formation regions A2 and A3 of the substrate materials 75 and 76.

The structure illustrated in FIG. 13C is diced and cut along the cutting lines B2 of the substrate material 75 and the cutting lines B3 of the substrate material 76 to singulate three electronic component incorporated substrates 1. The above manufacturing steps simultaneously manufacture three electronic component incorporated substrates 1. The number of simultaneously manufactured electronic component incorporated substrates 1 is not limited to three. By changing the size of the first and second substrates 2 and 5, any number of electronic component incorporated substrates 1 may be simultaneously manufactured.

The first embodiment has the advantages described below.

(1) Each spacer unit 6, which electrically connects the first substrate 2 and the second substrate 5, includes a stacked structure of the cored solder ball 40, the metal post 50, and the cored solder ball 60. This allows for the minimum pitch of the spacer units 6 to be narrowed. Thus, the pitch of the connection pads P2 and P5 may easily be narrowed when the wiring patterns 20 and 36 and the like are miniaturized. In other words, even when increasing the height of the semiconductor chip 3 arranged between the first substrate 2 and the second substrate 5, the pitch of the connection pads P2 and P5 may easily be narrowed.

(2) The upper surface 50B of each metal post 50 is flush with the surface 7B of the encapsulating resin 7 that covers the side wall of each metal post 50, and the cored solder balls 60 are mounted on the upper surfaces 50B of the metal posts 50. Even when a displacement occurs in the cored solder balls 60 mounted on the upper surfaces 50B of the metal posts 50, the cored solder balls 60 may be mounted on the upper surfaces 50B of the metal posts 50. That is, the connectivity of the metal posts 50 and the cored solder balls 60 may be improved because the upper surface 50B of each metal post 50 is flush with the surface 7B of the encapsulating resin 7.

(3) A metal post, which is a rod-shaped connection terminal, may be formed in the following manner. A barrier metal layer is formed on a connection pad P5 or a connection pad P2. The pad (barrier metal layer) is exposed, a plating resist is patterned, and a rod-shaped connection terminal is then formed by performing a plating (e.g., electrolytic copper plating) on the barrier metal layer. Then, the plating resist is removed, and the exposed barrier metal layer is etched. Such a manufacturing method may form a metal post. However, when forming a metal post through plating, variations easily occur in the plating thickness. Thus, when tall metal posts are formed, variations in the height of the metal post increases.

In contrast, in the first embodiment, the metal plate 70 is etched to form the metal posts 50. Thus, in comparison to when forming metal posts through plating, variations may be reduced in the height of the metal posts 50. This improves the connectivity of the first substrate 2 and the second substrate 5.

(4) The metal plate 70, which includes the projections 73 bonded to the cored solder balls 40, is mounted on the substrate material 75, and the encapsulating resin 7 is formed filling the space between the metal plate 70 and the substrate material 75. Then, the metal plate 70 is thinned to form the metal posts 50. As a result, with the encapsulating resin 7 covering the side walls of the projections 73 (metal posts 50), the metal plate 70 is etched and thinned. Thus, the encapsulating resin 7 suppresses the removal of the side walls of the projections 73 (metal posts 50) during etching. Further, the encapsulating resin 7 ultimately fills the space between the substrate materials 75 and 76 (first and second substrates 2 and 5). Accordingly, a protective film that protects the projections 73 so that the side walls of the projections 73 are not removed during etching does not have to be formed separately from the encapsulating resins 7 and 8 that fill the space between the substrate materials 75 and 76.

(5) The metal plate 70 includes the opening 70Y at a location overlapped with the semiconductor chip 3 as viewed from above when mounting the metal plate 70 on the substrate material 75. Thus, interference is suppressed between the semiconductor chip 3 and the metal plate 70 regardless of the height of the projections 73, which form the metal posts 50, and the height of the cored solder balls 40. Thus, the total height of the projections 73, which form the metal posts 50, and the cored solder balls 40 may be set to be less than the total thickness of the semiconductor chip 3 and the bumps 3a. As a result, the upper surface 50B of each metal post 50 and the surface 7B of the encapsulating resin 7 may be formed at a position lower than the upper surface of the semiconductor chip 3, and the cored solder balls 60 may be mounted at that position. Accordingly, the distance between the first substrate 2 and the second substrate 5 may be decreased in comparison to when the upper surface 50B of the metal post 50 and the surface 7B of the encapsulating resin 7 are flush with the surface 7A of the encapsulating resin 7.

A second embodiment will now be described with reference to FIGS. 14 to 16C. An electronic component incorporated substrate 1A of the second embodiment differs from the first embodiment in that an insulation layer 9 is arranged between the encapsulating resin 7 and the second substrate 5. The following description will center on the differences from the first embodiment. Like or same reference numerals are given to those components that are the same as the corresponding components illustrated in FIGS. 1 to 13C. Such components will not be described in detail.

Figure 14:
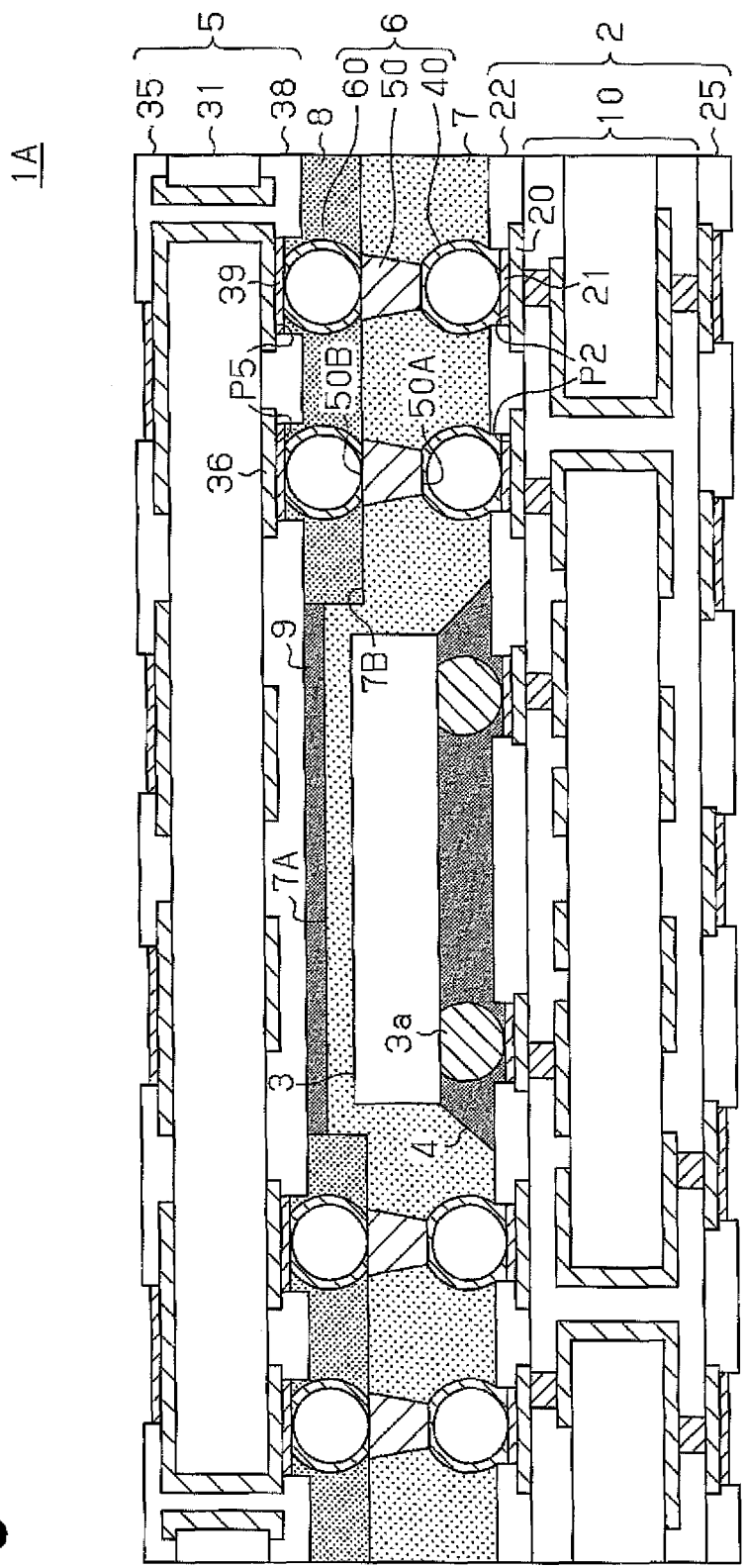
FIG. 14 is a schematic cross-sectional view illustrating a second embodiment of an electronic component incorporated substrate.

Referring to FIG. 14, an insulation layer 9 is formed in the space between the encapsulating resin 7 and the second substrate 5. The insulation layer 9 fills the space between the surface 7A of the encapsulating resin 7, which is formed in the region covering the semiconductor chip 3, and the solder resist layer 38 of the second substrate 5. An insulative resin such as an epoxy resin may be used as the material of the insulation layer 9.

The encapsulating resin 8 is formed between the second substrate 5 and the encapsulating resin 7 that is formed in a peripheral region surrounding the region covering the semiconductor chip 3 as viewed from above. That is, the encapsulating resin 8 fills the space between the surface 7B of the encapsulating resin 7 and the solder resist layer 38 of the second substrate 5.

In this manner, in the electronic component incorporated substrate 1A, the space between the encapsulating resin 7 and the second substrate 5 is filled with the encapsulating resin 8 and the insulation layer 9. The encapsulating resin 8 and the insulation layer 9 function as an adhesive that adheres the encapsulating resin 7 (first substrate 2) and the second substrate 5, and function as a protective layer that protects the cored solder balls 60. That is, in the electronic component incorporated substrate 1A, the encapsulating resin 8 and the insulation layer 9 function as a second encapsulating resin.

A method for manufacturing the electronic component incorporated substrate 1A will now be described with reference to FIGS. 15A to 16C. FIG. 15A illustrates the cross-sectional structure of the first substrate material 75 taken along line G-G in FIG. 15B during a manufacturing process.

In the step illustrated in FIG. 15A, the same steps as the steps illustrated in FIGS. 4 to 11 are performed. This bonds the stacked structure of the cored solder ball 40 and the metal post 50 to the metal layer 21 formed on each connection pad P2 of the first substrate material 75, and forms the encapsulating resin 7 on the solder resist layer 22 of the substrate material 75. The encapsulating resin 7 covers the semiconductor chip 3, the cored solder balls 40, and the side walls of the metal posts 50. The upper surface of the encapsulating resin 7 includes the surface 7A, which is formed in the region covering the semiconductor chip 3 (i.e., region corresponding to the opening 70Y of the metal plate 70 illustrated in FIG. 10A), and the surface 7B, which is formed in the peripheral region surrounding the surface 7A. A step is formed by the surfaces 7A and 7B.

In the step illustrated in FIG. 15A, the insulation layer 9 is formed on the surface 7A of the encapsulating resin 7 in a B-stage (semi-cured state). As illustrated in FIG. 15B, the insulation layer 9 is frame-shaped as viewed from above in the central portion of each substrate formation region A2 (region overlapped with semiconductor chip 3 mounted on the substrate material 75 as viewed from above). An adhesive sheet of a B-stage state (semi-cured state) insulative resin or an adhesive paste of an insulative resin may be used as the material of the insulation layer 9. Other materials that may be used for the insulation layer 9 include an epoxy resin including an inorganic filler, an epoxy resin that does not include an inorganic filler, and a liquid crystal polymer. Such a resin material of the insulation layer 9 may be, for example, a thermosetting resin.

When using, for example, an adhesive sheet of an insulative resin as the insulation layer 9, a sheet of insulative resin formed in the shape of a frame as viewed from above may be laminated on the surface 7A of the encapsulating resin 7. In this step, the sheet of insulative resin is not thermally cured and left in the B-stage state. By laminating the sheet of insulative resin in a vacuum atmosphere, the formation of voids in the insulation layer 9 may be suppressed. Further, when using a paste of insulative resin as the insulation layer 9, screen printing may be performed to form a liquid or paste of insulative resin on the surface 7A of the encapsulating resin 7. Then, prebaking is then performed to semi-cure the insulative resin. The semi-cured insulative resin is adhesive.

Figure 16A:
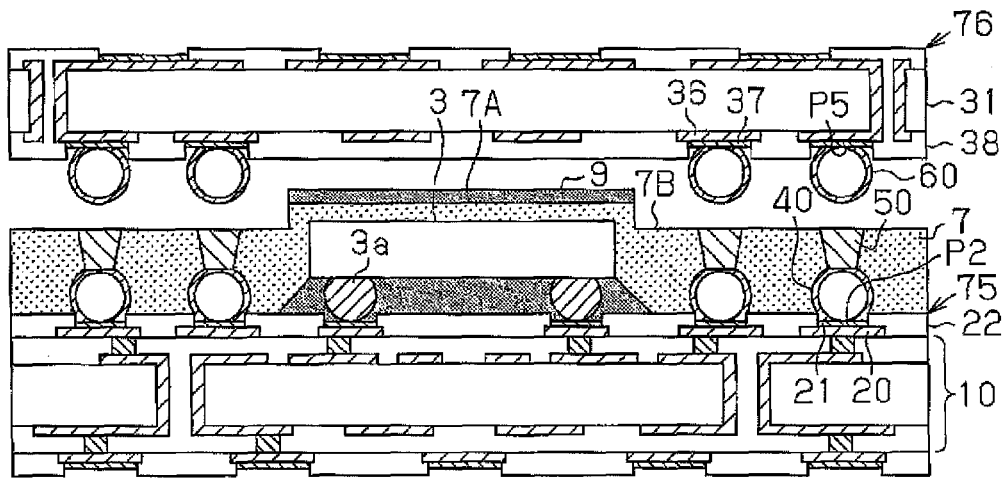
FIGS. 16A to 16C are schematic cross-sectional views illustrating the method for manufacturing the electronic component incorporated substrate of FIG. 14.

In the step illustrated in FIG. 16A, the second substrate material 76 bonded to the cored solder balls 60 is arranged above the structure illustrated in FIG. 15A. More specifically, the two substrate materials 75 and 76 are positioned so that the surface 7B of the encapsulating resin 7 formed on the first substrate material 75 and the upper surface of the insulation layer 9 oppose the lower surface of the solder resist layer 38 of the second substrate material 76 and so that the cored solder balls 60 (connection pads P5) oppose the metal posts 50 (connection pads P2).

Figure 16B:
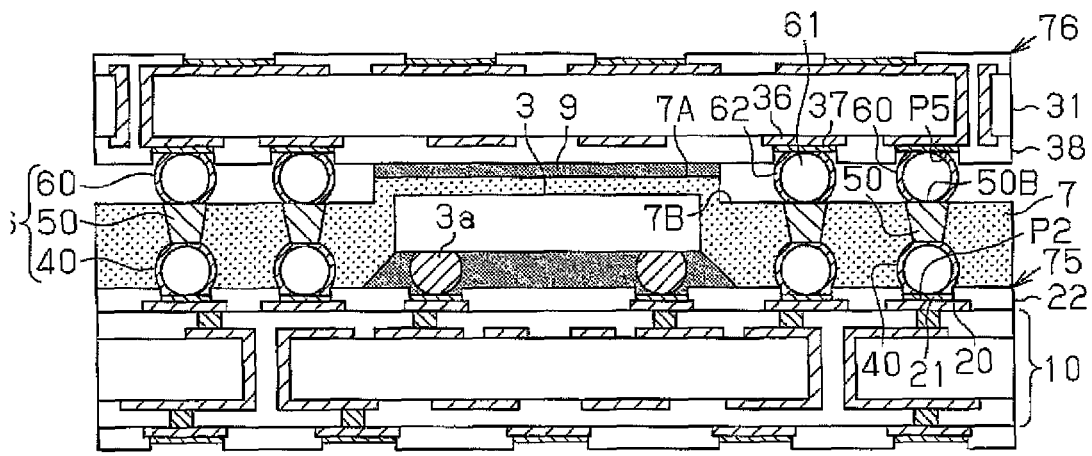

In the step illustrated in FIG. 16B, the cored solder balls 60 are bonded to the upper surfaces 50B of the metal posts 50 that form pads. More specifically, the adhesion of the insulation layer 9 that is in the B-stage state and not thermally cured is used to tentatively fix the second substrate material 76 to the first substrate material 75 through the insulation layer 9. If necessary, the second substrate material 76 may be forced toward the insulation layer 9 (first substrate material 75). Here, the cored solder balls 60 bonded to the second substrate material 76 are arranged at positions corresponding to the metal posts 50 bonded to the first substrate material 75. Then, by raising the temperature to approximately 230° C. to 260° C. and applying a load from above to the second substrate material 76, the solder 62 of the cored solder balls 60 is melted, and the cored solder balls 60 are bonded to the upper surfaces 50B of the metal posts 50. In this manner, the spacer units 6 are formed by sequentially stacking the cored solder balls 40, the metal posts 50, and the cored solder balls 60. Further, the spacer units 6 fix the second substrate material 76 to the first substrate material 75. The semi-cured insulation layer 9 undergoes a heating process during or after the stacking of the two substrate materials 75 and 76. This thermally cures the insulation layer 9 when heated at a curing temperature or greater for a given time. As a result, the thermally cured insulation layer 9 adheres the second substrate material 76 and the encapsulating resin 7. Further, the thermally cured insulation layer 9 fills the space between the surface 7A of the encapsulating resin 7 and the second substrate material 76.

Figure 16C:
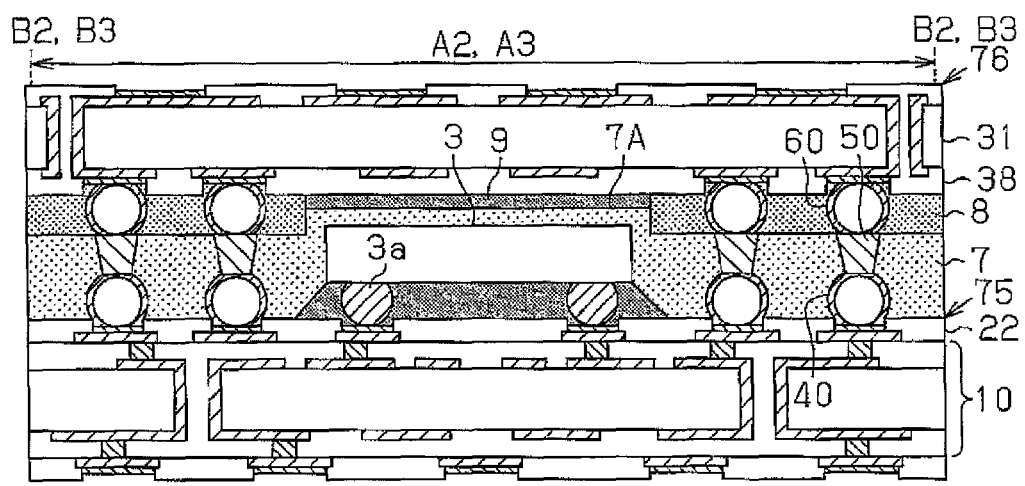

In the step illustrated in FIG. 16C, the encapsulating resin 8 is formed to fill the space between the two substrate materials 75 and 76, that is, the space between the surface 7B of the encapsulating resin 7 and the lower surface of the solder resist layer 38. The encapsulating resin 8, the encapsulating resin 7, and the insulation layer 9 rigidly fix the substrate material 75 and the substrate material 76. For example, when using a thermosetting molding resin as the material of the encapsulating resin 8, the structure illustrated in FIG. 16B is arranged in a molding die, pressure (e.g., 5 to 10 MPa) is applied to the interior of the molding die, and a flux of the molding resin is charged into the molding die. Then, the resin is heated to, for example, approximately 180° C. and cured to form the encapsulating resin 8. The molding resin may be charged through, for example transfer molding, compression molding, and ink-jet molding.

The above manufacturing steps manufacture the structure corresponding to the electronic component incorporated substrate 1A in the substrate formation regions A2 and A3 of the substrate materials 75 and 76.

In addition to advantages (1) to (5) of the first embodiment, the second embodiment has the following advantage.

(6) In the region of the opening 70Y (refer to FIG. 10) of the metal plate 70, the encapsulating resin 7 is thicker than other regions. Thus, the distance between the surface 7A of the encapsulating resin 7 and the lower surface of the solder resist layer 38 is shorter than the distance between the surface 7B of the encapsulating resin 7 and the lower surface of the solder resist layer 38. When filing a resin layer, namely, the encapsulating resin 7, into such a space using through a resin molding process, the space needs a certain height to smoothly fill the resin layer. That is, the distance between the surface 7A of the encapsulating resin 7 and the lower surface of the solder resist layer 38 should allow the resin layer to be smoothly filled. This increases the distance between the first substrate 2 and the second substrate 5.

In contrast, in the second embodiment, the semi-cured insulation layer 9 is formed on the surface 7A of the encapsulating resin 7. Accordingly, the space between the surface 7A of the encapsulating resin 7 and the lower surface of the solder resist layer 38 is filled with the insulation layer 9. This allows the distance to be decreased between the lower surface 7A of the encapsulating resin 7 and the lower surface of the solder resist layer 38. Consequently, the distance may be decreased between the first substrate 2 and the second substrate 5. Accordingly, the entire electronic component incorporated substrate 1A may be reduced in size.

It should be apparent to those skilled in the art that the present invention may be embodied in many other specific forms without departing from the spirit or scope of the invention. Particularly, it should be understood that the present invention may be embodied in the following forms.

In each of the above embodiments, the second substrate material 76 is bonded to the first substrate material 75. On the first substrate material 75, the stacked structure of the cored solder ball 40 and the metal post 50 is bonded to each connection pad P2. Further, the encapsulating resin 7 is formed on the first substrate material 75. On the second substrate material 76, the cored solder balls 60 are bonded to the connection pads P5. Instead of such a structure, after bonding the cored solder ball 60 to the upper surface 50B of each metal post 50 in the structure illustrated in FIG. 10B, the connection pads P5 may be bonded to the cored solder balls 60 to stack the second substrate material 76 on the first substrate material 75.

Figure 17A:
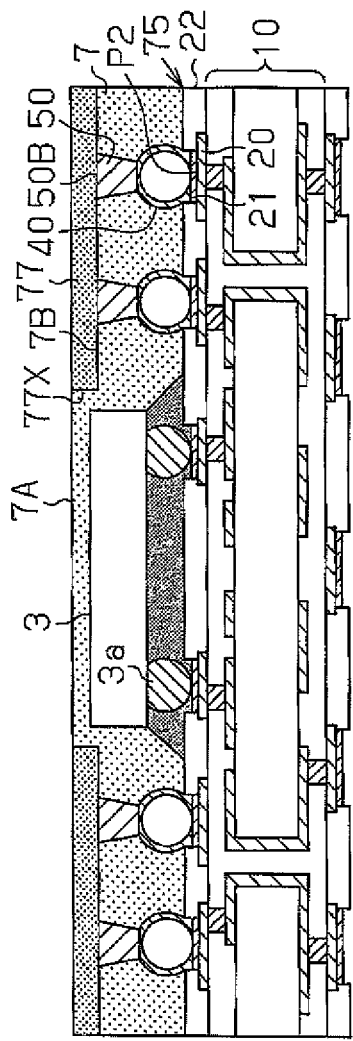
FIG. 17A is a schematic cross-sectional view illustrating a method for manufacturing a modified example of an electronic component incorporated substrate.
Figure 17B:
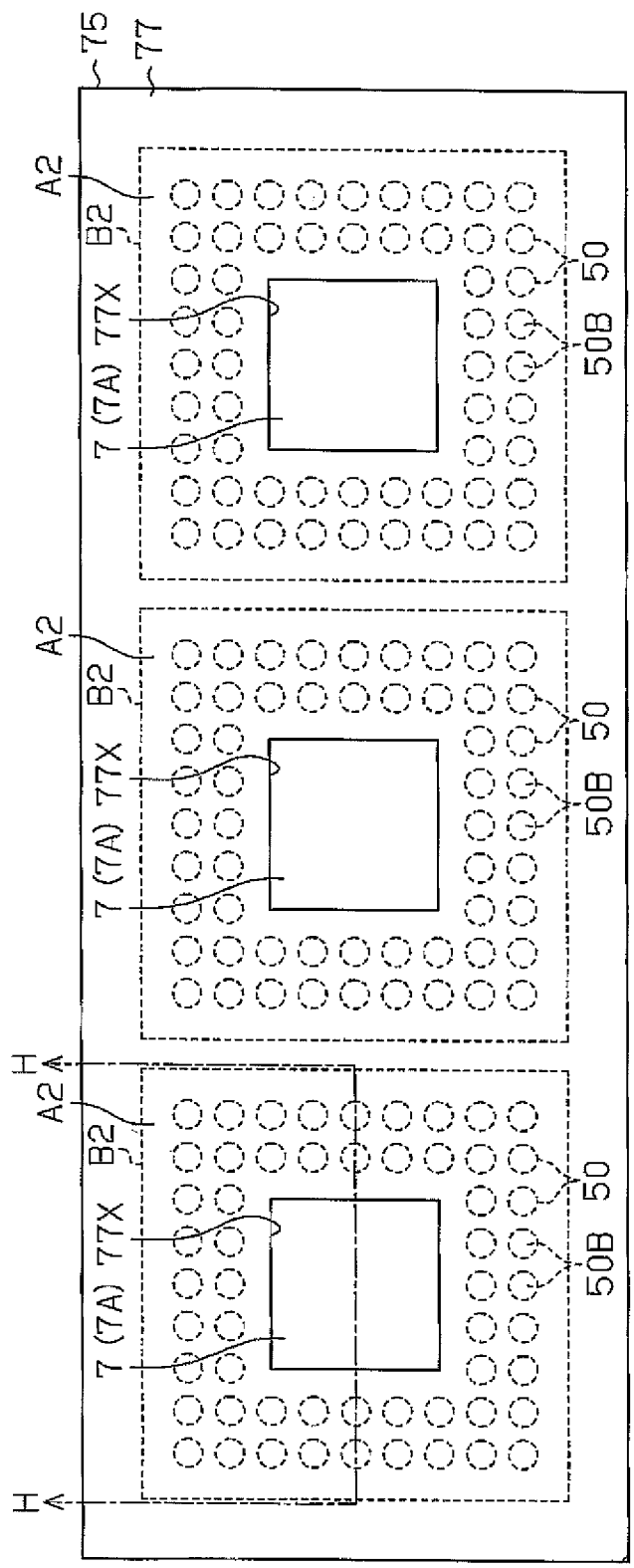
FIG. 17B is a schematic plan view illustrating the method for manufacturing the electronic component incorporated substrate of FIG. 17A.
Figure 18A:
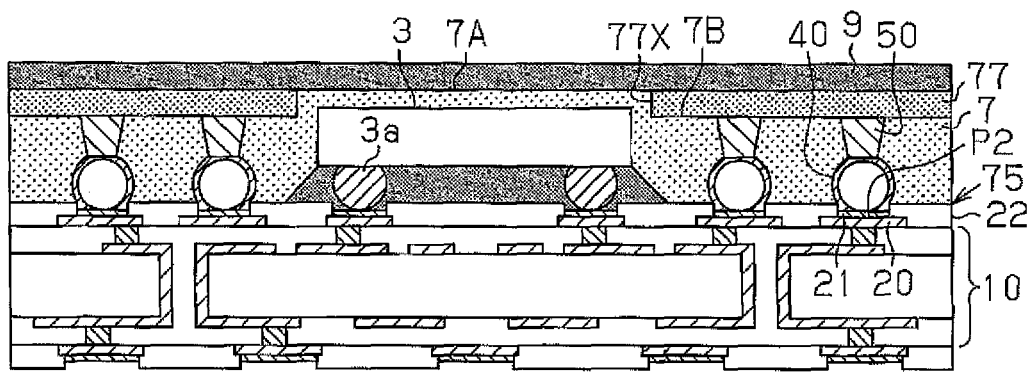
FIGS. 18A and 18B are schematic cross-sectional views illustrating the method for manufacturing the electronic component incorporated substrate of FIG. 17A.
Figure 18B:
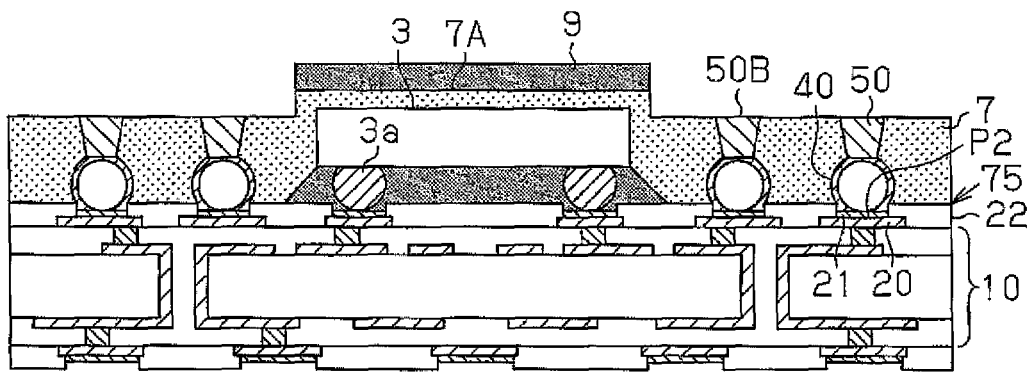

The insulation layer 9 of the second embodiment may be formed through the method illustrated in FIGS. 17A, 17B, 18A, and 18B. FIGS. 17A, 18A, and 18B illustrate the cross-sectional structure of the first substrate material 75 taken along line H-H in FIG. 17B during the manufacturing process.

First, in the step illustrated in FIG. 17A, the same steps as the steps illustrated in FIGS. 4 to 11 are performed. This bonds the stacked structure of the cored solder ball 40 and the metal post 50 on the metal layer 21 formed on each connection pad P2 of the first substrate material 75, and forms the encapsulating resin 7 on the solder resist layer 22 of the substrate material 75. The encapsulating resin 7 covers the semiconductor chip 3, the cored solder balls 40, and the side walls of the metal posts 50. The upper surface of the encapsulating resin 7 includes a surface 7A in the region covering the semiconductor chip 3 (i.e., region corresponding to opening 70Y of metal plate 70 illustrated in FIG. 10A) and a surface 7B formed by the peripheral region surrounding the surface 7A. The surfaces 7A and 7B form a step.

In the step illustrated in FIG. 17A, a defoliation film 77 including an opening 77X corresponding to the pattern of the insulation layer 9 is adhered to the encapsulating resin 7. That is, the defoliation film 77 is applied to only the surface 7B of the encapsulating resin 7. As illustrated in FIG. 17B, the opening 77X is tetragonal as viewed from above and formed in the central portion of each substrate formation region A2 to expose the surface 7A of the encapsulating resin 7. For example, the opening 77X is punched out in advance from the defoliation film 77 with a die before the defoliation film 77 is adhered to the encapsulating resin 7. Alternatively, after the defoliation film 77 is adhered to the entire upper surface of the encapsulating resin 7, a laser or the like may be used to cut the defoliation film 77 along the contour of the openings 77X. Then, the defoliation film 77 may be removed to form the openings 77X.

Vinyl chloride or a PET film may be used as the material of the defoliation film 77. An adhesive agent formed from an acrylic resin is applied to the lower surface of the defoliation film 77, and the defoliation film 77 is tentatively adhered to allow for easy removal from the encapsulating resin 7.

In the step illustrated in FIG. 18A, the insulation layer 9, which is in a B-stage state, is formed on the surface 7A of the encapsulating resin 7 and the defoliation film 77 to entirely cover the upper surface of the encapsulating resin 7.

Then, the defoliation film 77 is removed from the encapsulating resin 7. Here, portions of the insulation layer 9 arranged on the defoliation film 77 are torn apart from portions of the insulation layer 9 that are not arranged on the defoliation film 77 (i.e., from insulation layer 9 formed on the surface 7A of the encapsulating resin 7) and thereby removed from the encapsulating resin 7 together with the defoliation film 77. FIG. 18B illustrates the cross-sectional structure subsequent to the removal of the defoliation film 77. In this step, the insulation layer 9 is in a semi-cured state. Thus, the insulation layer 9 may easily be torn apart in the thicknesswise direction by removing the defoliation film 77 from the encapsulating resin 7.

This method also allows for the formation of the insulation layer 9 of the second embodiment.

In each of the above embodiments, the resin molding process is performed to form the encapsulating resin 7. Instead, for example, a potting process may be performed to form the encapsulating resin 7.

In each of the above embodiments, the resin molding process is performed to form the encapsulating resin 8. Instead, the encapsulating resin 8 may be formed as described below. A modification of the method for forming the encapsulating resin 8 of the first embodiment will now be described.

First, an insulation layer is formed in a semi-cured state on the upper surface (surfaces 7A and 7B) of the encapsulating resin 7 and the upper surface 50B of each metal post 50. Then, the adhesion of the insulation layer is used to tentatively fix the second substrate material 76 with the cored solder balls 60 to the first substrate material 75 through the insulation layer. This structure is heated to a temperature of approximately 230° C. to 260° C., and a load is applied from above to the substrate material 76 to electrically connect the cored solder ball 60 and the metal post 50. As a result, the cored solder balls 60 pierce the insulation layer and connect to the metal posts 50. Further, the above heating process melts the solder 62 of each cored solder ball 60. This bonds the cored solder balls 60 to the metal posts 50. Such a method also fixes the second substrate material 76 to the first substrate material 75 with the spacer units 6, each including the stacked structure of the cored solder ball 40, the metal post 50, and the cored solder ball 60 that are sequentially stacked. A heating process is performed after or during the stacking of the two substrate materials 75 and 76 to thermally cure the semi-cured insulation layer at a curing temperature or greater for a given time. The thermally cured insulation layer adheres the second substrate material 76 and the encapsulating resin 7. Further, the thermally cured insulation layer fills the space between the second substrate material 76 and the surfaces 7A and 7B of the encapsulating resin 7. In this modification, the thermally cured insulation layer functions as the encapsulating resin 8.

Figure 19A:
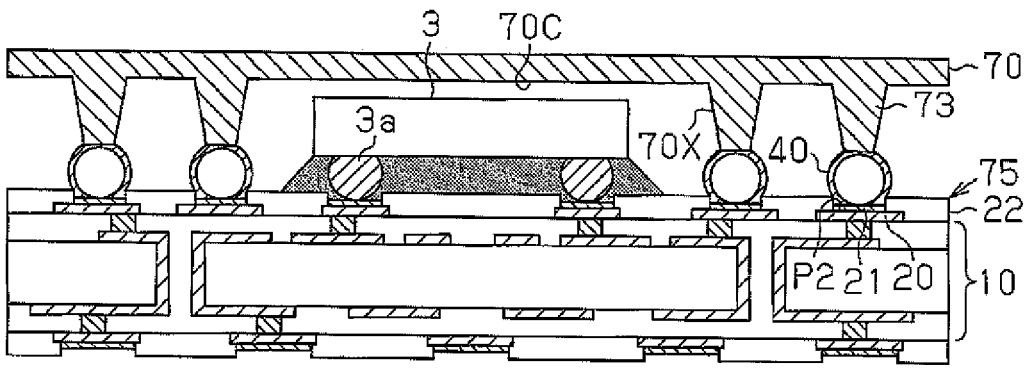
FIGS. 19A to 19C are schematic cross-sectional views illustrating a method for manufacturing another modification of an electronic component incorporated substrate.
Figure 19B:
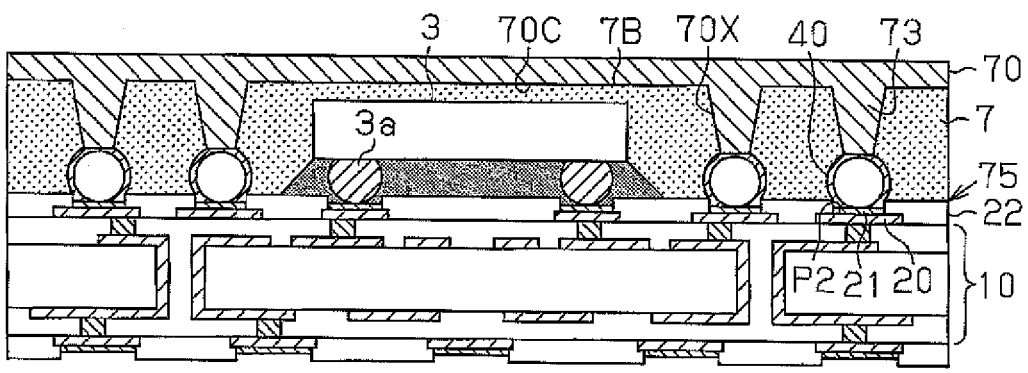
Figure 19C:
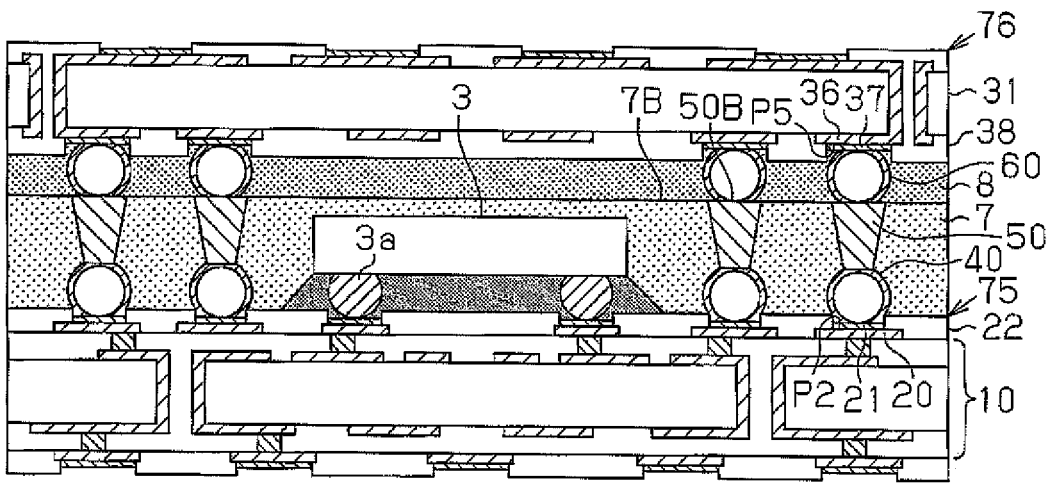

In each of the above embodiments, the opening 70Y is formed in the metal plate 70, and the opening 70Y is filled with the encapsulating resin 7. Instead, the opening 70Y of the metal plate 70 may be omitted. In this case, as illustrated in FIG. 19A, the height of the projection 73 and the cored solder ball 40 is set so that the bottom surface 70C of each recess 70X in the metal plate 70 does not contact the semiconductor chip 3 when the metal plate 70 is mounted on the first substrate material 75 with the cored solder balls 40 arranged in between. That is, the total height of the projection 73 and the cored solder balls 40 is set to be greater than the thickness of the semiconductor chip 3 and the bumps 3a. After the metal plate 70 is fixed to the substrate material 75, in the step illustrated in FIG. 19B, the encapsulating resin 7 is filled in the space between the substrate material 75 and the bottom surface 70C of each recess 70X. Here, the surface 7B of the encapsulating resin 7 contacts the bottom surface 70C at both of the region covering the semiconductor chip 3 and the region covering the projections 73 and the cored solder balls 40. Thus, the surface 7B is generally flush in the two regions. Then, the metal plate 70 is etched and thinned until removing the portions of the metal plate 70 other than the projections 73. As a result, as illustrated in FIG. 19C, the metal post 50 is formed with the upper surface 50B generally flush with the surface 7B of the encapsulating resin 7. Then, in the same steps as those illustrated in FIGS. 12A to 13C, the cored solder balls 60 bonded to the second substrate material 76 is bonded to the metal posts 50. This fixes the substrate material 75, which includes the encapsulating resin 7, to the substrate material 76. Then, the space between the encapsulating resin 7 and the substrate material 76 is filled with the encapsulating resin 8. This manufactures an electronic component incorporated substrate similar to that of the first embodiment.

Such a manufacturing method forms the encapsulating resin 7 with a generally flush upper surface (surface 7B), and the surface 7B of the encapsulating resin 7 is generally flush with the upper surface 50B of the metal post 50. This smoothly charges resin into the space between the surface 7B, the upper surface 50B, and the substrate material 76 when forming the encapsulating resin 8.

In each of the above embodiments, a metal layer (plating layer) may be formed on the surface 73A of each projection 73 on the metal plate 70 (surface forming upper surface 50B of each metal post 50). One example of a method for forming the metal plate 70 will now be described with reference to FIGS. 20A to 20D and 21A to 21E.

Figure 20A:
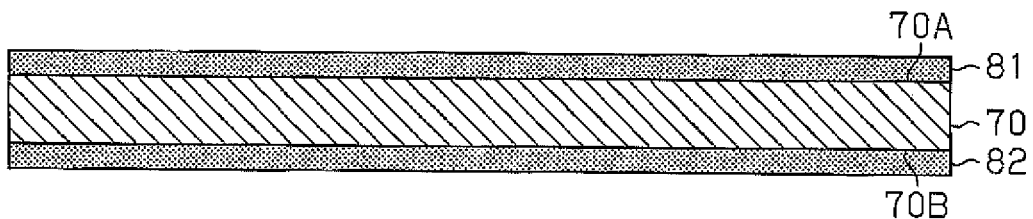
FIGS. 20A to 20D are schematic cross-sectional views illustrating a method for manufacturing a further modification of an electronic component incorporated substrate.
Figure 20B:
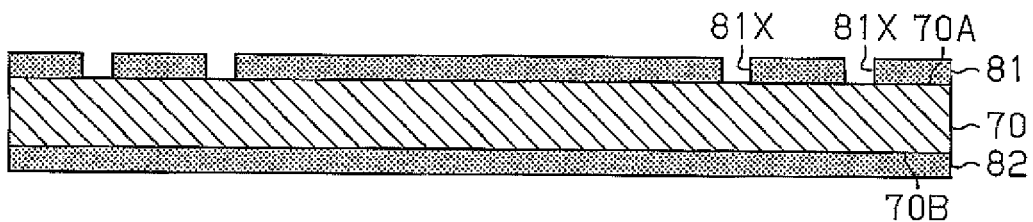

In the step illustrated in FIG. 20A, a resist layer 81 is formed to entirely cover the surface 70A of the metal plate 70, and a resist layer 82 is formed to entirely cover the surface 70B of the metal plate 70. Then, in the step illustrated in FIG. 20B, openings 81X are formed in the resist layer 81 at certain locations (locations where the metal posts 50 are formed). Taking into consideration the plating process performed in the next step, the materials of the resist layers 81 and 82 may be resistant to plating. For example, a photosensitive dry film resist or a liquid photoresist (e.g., dry film resist or liquid photoresist such as novolac resin or acrylic resin) may be used as the material of the resist layers 81 and 82. When using, for example, a photosensitive dry film resist, thermal compression bonding is performed to laminate a dry film on each of the surfaces 70A and 70B of the metal plate 70, and the dry film laminated on the surface 70A of the metal plate 70 is exposed and developed. This patterns the dry film and forms the openings 81X. As a result, the resist layer 81 including the openings 81X is formed on the surface 70A of the metal plate 70, and the resist layer 82 is formed entirely covering the surface 70B of the metal plate 70. When using a liquid photoresist, the same step may be performed to form the resist layers 81 and 82.

Figure 20C:
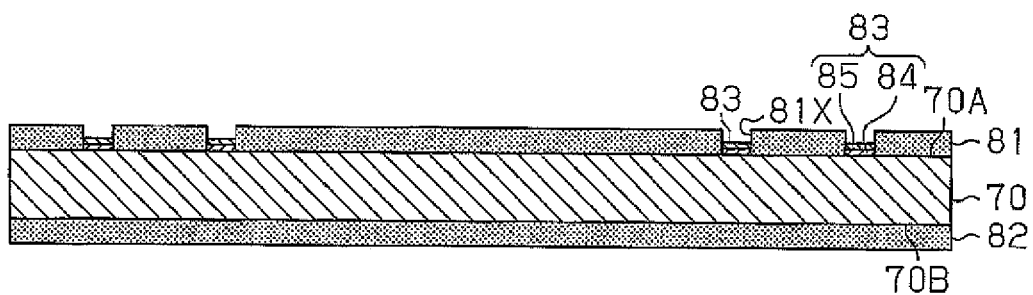

In the step illustrated in FIG. 20C, electrolytic plating is performed on the surface 70A of the metal plate 70 using the resist layers 81 and 82 as plating masks. The electrolytic plating uses the metal plate 70 as a plating power supply layer. More specifically, an electrolytic plating process is performed on the surface 70A of the metal plate 70 exposed from the openings 81X of the resist layer 81 to form a metal layer 83 on the metal plate 70. When the metal layer 83 is a stacked structure of an Ni layer 84 and an Au layer 85, the electrolytic plating process sequentially stacks the Ni layer 84 and the Au layer 85 on the surface 70A of the metal plate 70 exposed from each opening 81X of the resist layer 81.

Figure 20D:
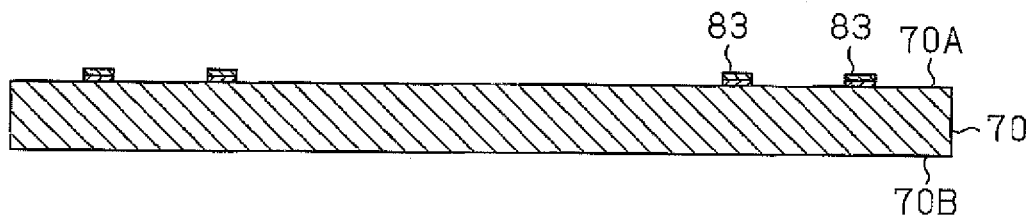

In the step illustrated in FIG. 20D, the resist layers 81 and 82 illustrated in FIG. 20C are removed with an alkali defoliation liquid.

Figure 21A:
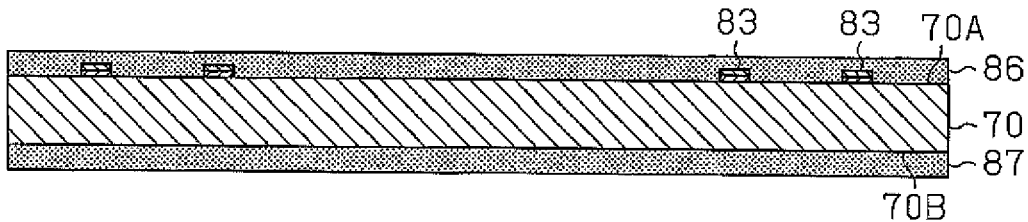
FIGS. 21A to 21E are schematic cross-sectional views illustrating a method for manufacturing yet another modification of an electronic component incorporated substrate
Figure 21B:
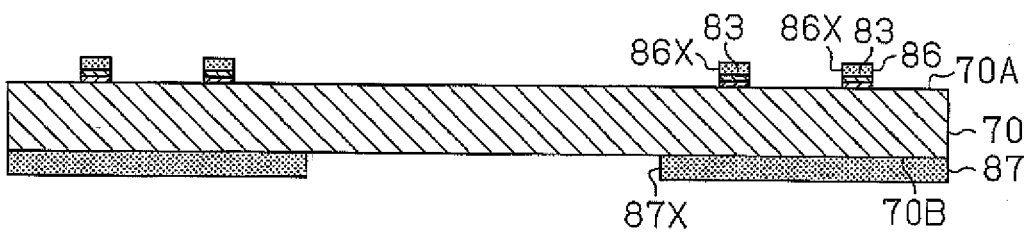

In the step illustrated in FIG. 21A, a resist layer 86 is formed to entirely cover the metal layer 83 and the surface 70A of the metal plate 70. Further, a resist layer 87 is formed to entirely cover the surface 70B of the metal plate 70. Then, in the step illustrated in FIG. 21B, openings 86X are formed in the resist layer 86 leaving the resist layer 86 at certain locations where the metal layer 83 is formed, that is, where the metal posts 50 are to be formed. Further, an opening 87X is formed in correspondence with the mounting region of the semiconductor chip 3 mounted on the first substrate 2. Taking into consideration the etching process performed in the next step, the materials of the resist layers 86 and 87 may be resistant to etching. For example, the material of the resist layers 86 and 87 may be the same as the materials of the resist layers 71 and 72.

Figure 21C:
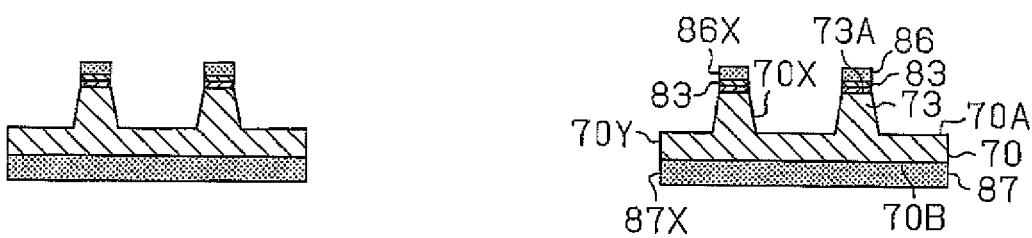

In the step illustrated in FIG. 21C, using the resist layers 86 and 87 and the metal layer 83 as etching masks, etching is performed on the surfaces 70A and 70B of the metal plate 70 exposed from the openings 86X and 87X. This forms recesses 70X in portions of the metal plate 70 exposed from the openings 86X. In other words, portions of the metal plate 70 covered by the resist layer 86 and the metal layer 83 form the projections 73. This forms the metal layer 83 on the surface 73A of each projection 73. Further, the opening 70Y is formed in the metal plate 70 that is exposed from both of the openings 86X and 87X.

Figure 21D:
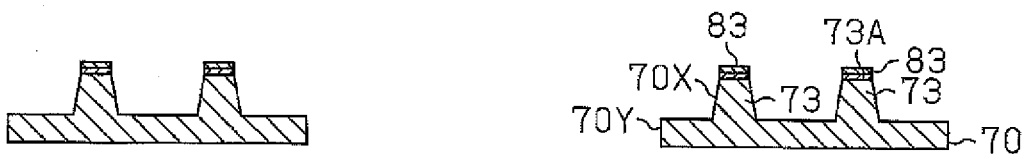

In the step illustrated in FIG. 21D, the resist layers 86 and 87 illustrated in FIG. 21C are removed with, for example, an alkali defoliation liquid.

Figure 21E:
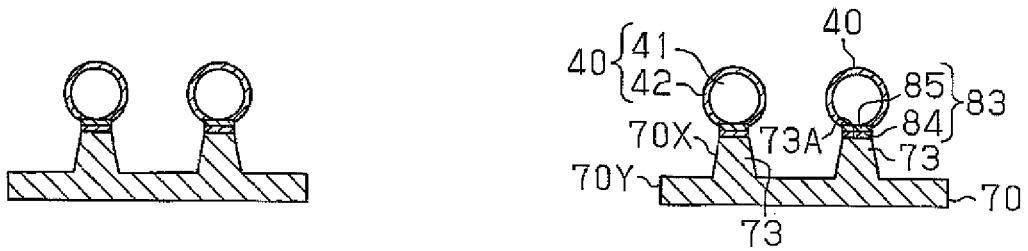

In the step illustrated in FIG. 21E, the cored solder ball 40 is mounted on the upper surface of the metal layer 83 (here, upper surface of Au layer 85) on the upper surface 73A of the projection 73. The cored solder ball 40 may be mounted after applying flux to the upper surface of the Au layer 85. Then, a reflow process is performed at a temperature of approximately 230° C. to 260° C. to fix the cored solder ball 40 to the upper surface of the Au layer 85. Then, the surface is washed to remove the flux.

In this manner, by forming the metal layer 83 on the surface 73A of each projection 73 that forms the lower surface 50A of each metal post 50, the connectivity of the metal post 50 and the cored solder ball 40 may be improved.

In each of the above embodiments, the spacer units 6 and the connection pads P2 and P5 are arranged at positions surrounding the peripheral edge of the semiconductor chip 3 as viewed from above. However, the layout is not limited in each of the above embodiments. For example, any one or more of the four sides surrounding the semiconductor chip 3 may be free from the spacer units 6 and the connection pads P2 and P5.

In each of the above embodiments, the upper surface 50B of each metal post 50 is flush with the surface 7B of the encapsulating resin 7 that contacts the side wall of the metal post 50. Instead, for example, the upper surface 50B of each metal post 50 may be recessed toward the lower surface 50A from the surface 7B of the encapsulating resin 7 that contacts the side wall of the metal post 50.

In each of the above embodiments, the copper core balls 41 and 61 are used as conductive core balls of the cored solder balls 40 and 60. Instead, a conductive core ball formed from a metal other than copper, such as gold or nickel, may be used. Alternatively, a solder ball that does not include a conductive core ball may be used in lieu of the cored solder balls 40 and 60.

In the first substrate 2 of each of the above embodiments, the structure of the layers located inward from the wiring patterns 20 and 23 that are the outermost layers are not particularly limited. That is, the first substrate 2 only needs to have a structure electrically connecting the wiring patterns 20 and 23 of the outermost layers to each other through the interior of the substrate. The structure and material of the substrate core 11 is not particularly limited. Further, the number of wires (e.g., wires 15 and 16) formed on the substrate core 11 and number of insulation layers (e.g., insulation layers 13 and 14) covering the wires are not particularly limited. Further, the substrate body 10 may be replaced by a cored build-up substrate including the substrate core 11 or a coreless substrate that does not include the substrate core 11.

In the first substrate of each of the above embodiments, the metal layers 21 and 24 may be omitted.

In the second substrate 5 of each of the above embodiments, the structure of the layers located inward from the wiring patterns 33 and 36 that are the outermost layers are not particularly limited. That is, the second substrate 5 only needs to have a structure electrically connecting the wiring patterns 33 and 36 of the outermost layers to each other through the interior of the substrate. The structure and material of the substrate core 31 is not particularly limited. Further, a certain number of wires may be formed on the substrate core 31, and a certain number of insulation layers may cover the wires. Additionally, the second substrate 5 may be a coreless substrate that does not include the substrate core 31.

In the second substrate 5 of each of the above embodiments, the metal layers 34 and 37 may be omitted.

In each of the above embodiments, the manufacturing method is applied for case when a plurality of products are manufactured simultaneously in batches. Instead, the manufacturing method may be applied to when a single product is manufactured.

The present examples and embodiments are to be considered as illustrative and not restrictive, and the invention is not to be limited to the details given herein, but may be modified within the scope and equivalence of the appended claims.

The invention claimed is:

1. An electronic component incorporated substrate comprising:
   a first substrate;
   a second substrate;
   a spacer unit that electrically connects the first substrate and the second substrate;
   an electronic component mounted on the first substrate and arranged between the first substrate and the second substrate;
   a first encapsulating resin formed between the first substrate and the second substrate to encapsulate the electronic component; and
   a second encapsulating resin formed on a first surface of the first encapsulating resin to fill a space between the first encapsulating resin and the second substrate,
   wherein the spacer unit includes a stacked structure of a first solder ball, a metal post, and a second solder ball stacked in a stacking direction of the first substrate and the second substrate,
   the first encapsulating resin is continuous from a region in which the spacer unit is connected to the first substrate to a region in which the electronic component is mounted on the first substrate, and encapsulates a surface of the electronic component facing toward the second encapsulating resin, and
   the second substrate includes
      a first surface facing toward the second encapsulating resin, wherein a first connection pad for connection with the spacer unit is formed in the first surface of the second substrate, and
      a second surface opposite to the first surface of the second substrate, wherein a second connection pad for connection with an external component is formed in the second surface of the second substrate.

2. The electronic component incorporated substrate according to claim 1, wherein
   the first solder ball is bonded to the first substrate,
   the second solder ball is bonded to the second substrate,
   the metal post includes a first surface bonded to the first solder ball, a second surface opposite to the first surface of the metal post and bonded to the second solder ball, and a side wall,
   the first encapsulating resin covers the first solder ball, the side wall of the metal post, and the electronic component, and
   the second encapsulating resin covers the second solder ball.

3. The electronic component incorporated substrate according to claim 2, wherein
   the first surface of the first encapsulating resin includes a surface flush with the second surface of the metal post.

4. The electronic component incorporated substrate according to claim 1, wherein the first surface of the first encapsulating resin includes
   a second surface located in a region in which the first encapsulating resin covers the electronic component as viewed from above, and
   a third surface located in a region in which the first encapsulating resin covers the first solder ball and the side wall of the metal post as viewed from above, wherein the third surface is recessed toward the first substrate from the second surface of the first encapsulating resin.

5. The electronic component incorporated substrate according to claim 4, further comprising
   an insulation layer formed between the second surface of the first encapsulating resin and the second substrate,
   wherein the second encapsulating resin is formed between the third surface of the first encapsulating resin and the second substrate.

6. The electronic component incorporated substrate according to claim 1, wherein the metal post is tapered and has a diameter that decreases from the second substrate toward the first substrate.

7. The electronic component incorporated substrate according to claim 1, wherein each of the first solder ball and the second solder ball is a cored solder ball, the cored solder ball including a conductive core ball and solder encompassing the conductive core ball.

8. A method for manufacturing an electronic component incorporated substrate, the method comprising:
preparing a first substrate, wherein an electronic component is mounted on the first substrate;
sequentially stacking a first solder ball and a metal post on the first substrate;
forming a first encapsulating resin on the first substrate to cover the first solder ball, a portion of the metal post, and the electronic component;
preparing a second substrate;
bonding a second solder ball to the second substrate;
bonding the second solder ball to the metal post to electrically connect the second substrate to the first substrate through the first solder ball, the metal post, and the second solder ball; and
forming a second encapsulating resin on a first surface of the first encapsulating resin to fill a space between the first encapsulating resin and the second substrate,
wherein a spacer unit includes a stacked structure of the first solder ball, the metal post, and the second solder ball stacked in a stacking direction of the first substrate and the second substrate,
the first encapsulating resin is continuous from a region in which the spacer unit is connected to the first substrate to a region in which the electronic component is mounted on the first substrate, and encapsulates a surface of the electronic component facing toward the second encapsulating resin, and
the second substrate includes
a first surface facing toward the second encapsulating resin, wherein a first connection pad for connection with the spacer unit is formed in the first surface of the second substrate, and
a second surface opposite to the first surface of the second substrate, wherein a second connection pad for connection with an external component is formed in the second surface of the second substrate.

9. The method according to claim 8, wherein sequentially stacking a first solder ball and a metal post on the first substrate includes
forming a projection by thinning a certain location of a metal plate,
mounting the first solder ball on a first surface of the projection,
bonding the first solder ball to the first substrate to fix the metal plate to the first substrate, and
forming the metal post by thinning the metal plate to leave only the projection or only a portion of the projection, and
the forming of a first encapsulating resin on the first substrate includes filling the first encapsulating resin in a space between the metal plate and the first substrate.

10. The method according to claim 9, wherein
the forming of a projection includes
forming a recess in the metal plate to form the projection, and
forming an opening in the metal plate at a location corresponding to a mounting region of the electronic component,
the filling of the first encapsulating resin includes filling the first encapsulating resin in the space between the metal plate and the first substrate and in the opening,
the first surface of the first encapsulating resin includes a second surface located in a region where the first encapsulating resin fills the opening as viewed from above, and
the second surface of the first encapsulating resin is flush with a surface of the metal plate located at an opposite side of a bottom surface of the recess.

11. The method according to claim 10, further comprising forming a semi-cured insulation layer on the second surface of the first encapsulating resin before bonding the second solder ball to the metal post,
wherein the insulation layer fills a space between the second surface of the first encapsulating resin and the second substrate.

12. The method according to claim 9, wherein the forming of the metal post includes thinning the metal plate so that the metal post includes a first surface bonded to the first solder ball, a second surface opposite to the first surface of the metal post, and a side wall, and so that the first surface of the first encapsulating resin is flush with the second surface of the metal post.

* * * * *